(12) United States Patent
Jung et al.

(10) Patent No.: US 12,520,530 B2
(45) Date of Patent: Jan. 6, 2026

(54) SEMICONDUCTOR DEVICE AND METHOD OF FABRICATING THE SAME

(71) Applicant: Samsung Electronics Co., Ltd., Suwon-si (KR)

(72) Inventors: Hakchul Jung, Seoul (KR); Garoom Kim, Suwon-si (KR); Ingyum Kim, Bucheon-si (KR); Jiyun Han, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 540 days.

(21) Appl. No.: 18/049,036

(22) Filed: Oct. 24, 2022

(65) Prior Publication Data

US 2023/0268412 A1 Aug. 24, 2023

(30) Foreign Application Priority Data

Feb. 23, 2022 (KR) .................. 10-2022-0023787
Apr. 26, 2022 (KR) .................. 10-2022-0051295

(51) Int. Cl.
| | |
|---|---|
| *H10D 30/67* | (2025.01) |
| *H01L 23/528* | (2006.01) |
| *H10D 30/47* | (2025.01) |
| *H10D 30/62* | (2025.01) |
| *H10D 62/10* | (2025.01) |

(52) U.S. Cl.
CPC ..... *H10D 30/6735* (2025.01); *H01L 23/5283* (2013.01); *H10D 30/47* (2025.01); *H10D 30/6211* (2025.01); *H10D 30/6757* (2025.01); *H10D 62/121* (2025.01)

(58) Field of Classification Search
CPC .......... H10D 30/6735; H10D 30/6211; H10D 30/6757; H10D 62/121; H10D 30/47
See application file for complete search history.

(56) References Cited

U.S. PATENT DOCUMENTS

| | | |
|---|---|---|
| 10,332,881 B1 | 6/2019 | Badaroglu et al. |
| 10,431,686 B1 | 10/2019 | Yang et al. |
| 11,031,397 B2 | 6/2021 | Liaw |
| 11,075,195 B2 | 7/2021 | Wang et al. |
| 11,114,303 B2 | 9/2021 | Chang et al. |

(Continued)

FOREIGN PATENT DOCUMENTS

KR    20220003360 A    1/2022

*Primary Examiner* — Christine A Enad
(74) *Attorney, Agent, or Firm* — Wolf, Greenfield & Sacks, P.C.

(57) ABSTRACT

A semiconductor device includes a substrate including a first device region and a second device region, a first active pattern on the first device region, a second active pattern, which has a width smaller than the first active pattern, on the second device region, a first channel pattern on the first active pattern, a first source/drain pattern connected to the first channel pattern, a second channel pattern on the second active pattern, a second source/drain pattern connected to the second channel pattern, and a gate electrode that extends from the first channel pattern to the second channel pattern in a first direction. The first channel pattern includes a plurality of semiconductor patterns, which are vertically stacked and spaced apart from each other. The second channel pattern protrudes vertically from the second active pattern.

20 Claims, 39 Drawing Sheets

(56) References Cited

U.S. PATENT DOCUMENTS

| | | | |
|---|---|---|---|
| 11,145,761 B2 | 10/2021 | Sun et al. | |
| 11,158,632 B1 | 10/2021 | Liaw | |
| 11,244,947 B1 | 2/2022 | Zhang et al. | |
| 2020/0105761 A1 | 4/2020 | Liaw | |
| 2021/0074841 A1* | 3/2021 | Lin | H10D 30/43 |
| 2021/0143800 A1 | 5/2021 | Lee et al. | |
| 2021/0183852 A1 | 6/2021 | Li et al. | |
| 2021/0202465 A1* | 7/2021 | Wang | H10D 30/031 |
| 2021/0210479 A1* | 7/2021 | Kang | H03K 3/35625 |
| 2021/0296304 A1 | 9/2021 | Liaw | |
| 2021/0351175 A1 | 11/2021 | Wang et al. | |
| 2021/0367063 A1 | 11/2021 | Kao et al. | |
| 2021/0375686 A1* | 12/2021 | Kao | H10D 84/0158 |
| 2021/0408277 A1 | 12/2021 | Weng | |
| 2022/0005800 A1 | 1/2022 | Lee | |

\* cited by examiner

SEMICONDUCTOR DEVICE AND METHOD OF FABRICATING THE SAME

CROSS-REFERENCE TO RELATED APPLICATIONS

This U.S. non-provisional patent application claims priority under 35 U.S.C. § 119 to Korean Patent Application Nos. 10-2022-0023787 and 10-2022-0051295, filed on Feb. 23, 2022 and Apr. 26, 2022, respectively, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device including a field effect transistor and a method of fabricating the same.

A semiconductor device may include an integrated circuit composed of metal-oxide-semiconductor field-effect transistors (MOS-FETs). To meet an increasing demand for a semiconductor device with a small pattern size and a reduced design rule, the MOS-FETs may be aggressively scaled down. The scale-down of the MOS-FETs may lead to deterioration in operational properties of the semiconductor device. A variety of studies are being conducted to overcome technical limitations associated with the scale-down of the semiconductor device and to realize the semiconductor devices with high performance.

SUMMARY

An embodiment of the inventive concept provides a semiconductor device that can be operated with high performance and low power consumption characteristics.

According to an embodiment of the inventive concept, a semiconductor device may include a substrate including a first device region and a second device region, which are adjacent to each other in a first direction and extend in a second direction crossing the first direction, a first active pattern of a first width, on the first device region, a second active pattern on the second device region, the second active pattern having a second width smaller than the first width, a first channel pattern on the first active pattern and a first source/drain pattern connected to the first channel pattern, the first channel pattern including a plurality of semiconductor patterns which are vertically stacked and spaced apart from each other, a second channel pattern on the second active pattern and a second source/drain pattern connected to the second channel pattern, the second channel pattern vertically protruding from the second active pattern, and a gate electrode that extends from the first channel pattern to the second channel pattern in the first direction. The gate electrode may be adjacent to a first top surface, a first bottom surface, and opposite first side surfaces of each of the plurality of semiconductor patterns, and the gate electrode may be adjacent to a second top surface and opposite second side surfaces of the second channel pattern.

According to an embodiment of the inventive concept, a semiconductor device may include a substrate, a first power line, a second power line, and third power line on the substrate, the first, second, and third power lines being arranged in a first direction and extending in a second direction crossing the first direction, a GAAFET region between the first and second power lines, a FinFET region between the second and third power lines, and a gate electrode that extends from the GAAFET region to the FinFET region in the first direction. A first height of the GAAFET region in the first direction may be greater than a second height of the FinFET region in the first direction.

According to an embodiment of the inventive concept, a semiconductor device may include a first active pattern, a second active pattern, a third active pattern, and a fourth active pattern on a substrate, the first, second, third, and fourth active patterns being sequentially arranged in a first direction and extending in a second direction crossing the first direction, a first channel pattern, a second channel pattern, a third channel pattern, and a fourth channel pattern provided on the first, second, third, and fourth active patterns, respectively, each of the first and second channel patterns including a plurality of semiconductor patterns which are spaced apart from each other in a vertical stack in a third direction perpendicular to a plane formed by the first direction and the second direction, the third and fourth channel patterns protruding in the third direction from the third and fourth active patterns, respectively, a gate electrode that extends from the first channel pattern to the fourth channel pattern in the first direction, and a gate insulating layer between the gate electrode and the first, second, third, and fourth channel patterns. The gate insulating layer may be on a first top surface, a first bottom surface, and opposite first side surfaces of each of the plurality of semiconductor patterns, and the gate insulating layer may be on a second top surface and opposite second side surfaces of each of the third and fourth channel patterns, excluding a bottom surface of each of the third and fourth channel patterns.

DETAILED DESCRIPTION

Figure 1:
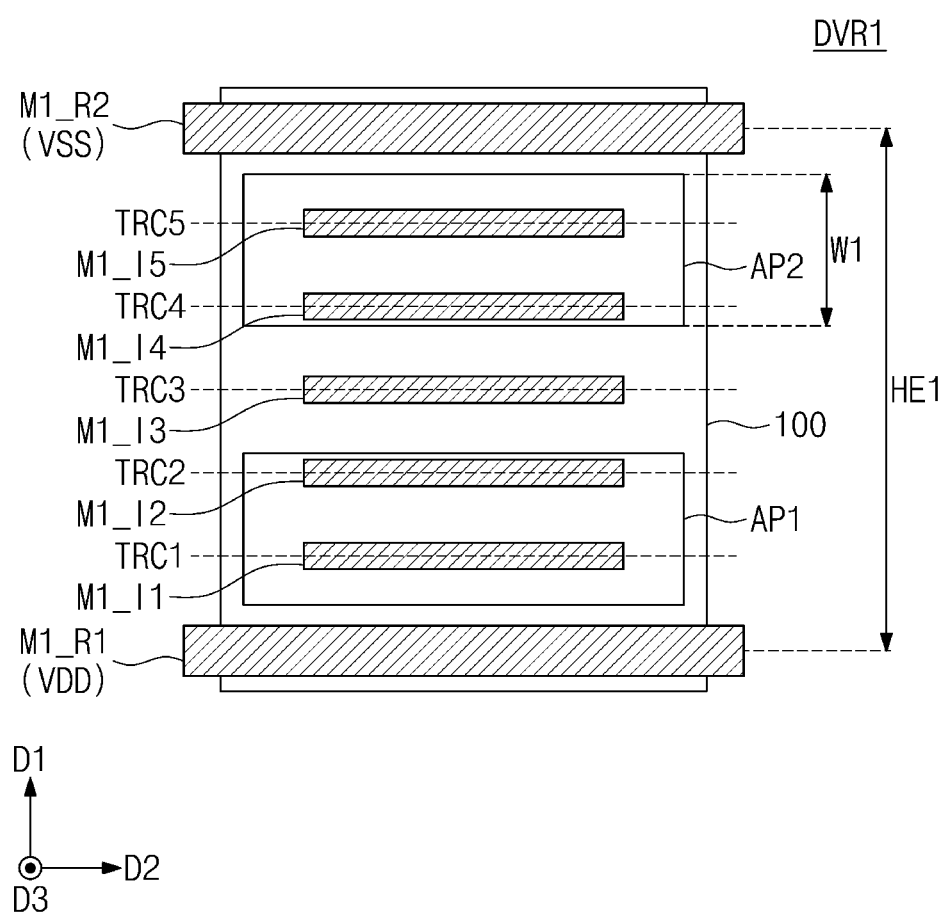
FIG. 1 is a plan view illustrating a first device region of a semiconductor device according to an embodiment of the inventive concept.

Example embodiments of the inventive concepts will now be described more fully with reference to the accompanying drawings, in which example embodiments are shown. The present disclosure may, however, be embodied in many different forms and should not be construed as limited to the embodiments set forth herein. In the drawings, like numerals refer to like elements throughout this application and repeated descriptions may be omitted. It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concept. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

Figure 2:
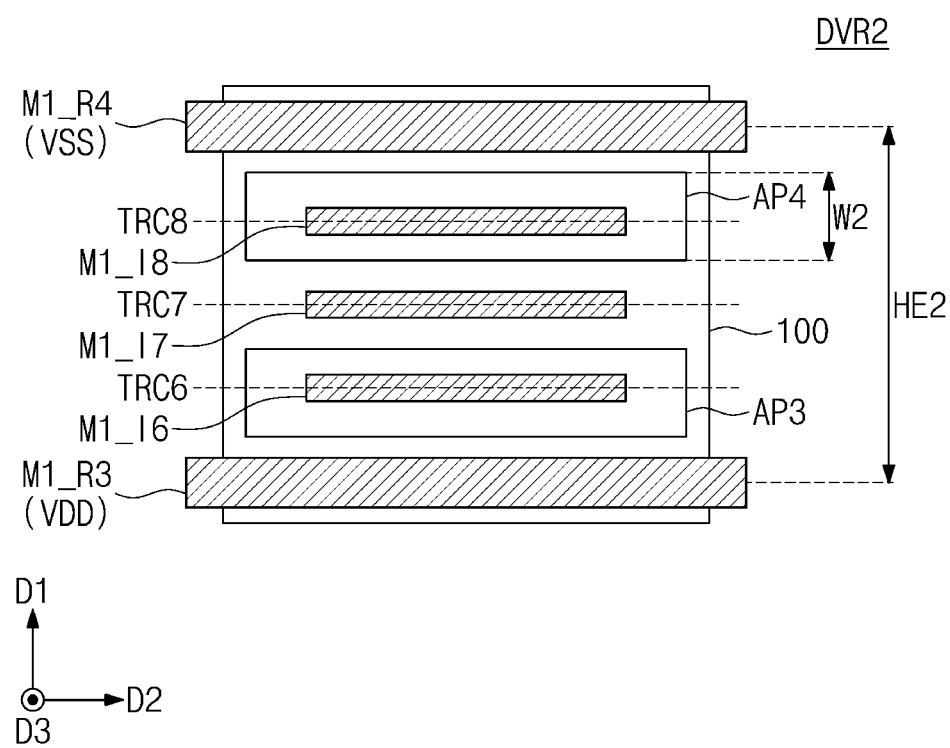
FIG. 2 is a plan view illustrating a second device region of a semiconductor device according to an embodiment of the inventive concept.

FIG. 1 is a plan view illustrating a first device region of a semiconductor device according to an embodiment of the inventive concept. FIG. 2 is a plan view illustrating a second device region of a semiconductor device according to an embodiment of the inventive concept.

Referring to FIG. 1, a first device region DVR1 may be provided on a substrate 100. In detail, a first power line M1_R1 and a second power line M1_R2 may be provided on the substrate 100. The first power line M1_R1 may be a conduction path, to which a drain voltage VDD (e.g., a power voltage) is provided. The second power line M1_R2 may be a conduction path, to which a source voltage VSS (e.g., a ground voltage) is provided.

The first device region DVR1 may be defined between the first power line M1_R1 and the second power line M1_R2. The first device region DVR1 may include one first active pattern AP1 and one second active pattern AP2. For example, the first active pattern AP1 may be a PMOSFET region, and the second active pattern AP2 may be an NMOSFET region. The first device region DVR1 may have a CMOS structure, which is provided between the first power line M1_R1 and the second power line M1_R2.

Each of the first and second active patterns AP1 and AP2 may have a first width W1 in a first direction D1. A length of the first device region DVR1 in the first direction D1 may be defined as a first height HE1. The first height HE1 may be substantially equal to a distance (e.g., a pitch) between the first power line M1_R1 and the second power line M1_R2.

First to fifth interconnection tracks TRC1 to TRC5 may be defined between the first power line M1_R1 and the second power line M1_R2. The first to fifth interconnection tracks TRC1 to TRC5 may be imaginary lines that extend in a second direction D2 to be parallel to each other. The first to fifth interconnection tracks TRC1 to TRC5 may be arranged at a generally constant pitch in the first direction D1.

First to fifth lower interconnection lines M1_I1 to M1_I5 may be provided between the first power line M1_R1 and the second power line M1_R2. The first to fifth lower interconnection lines M1_I1 to M1_I5 may extend in the second direction D2 to be parallel to each other. The first power line M1_R1, the second power line M1_R2, and the first to fifth lower interconnection lines M1_I1 to M1_I5 may constitute a first metal layer M1.

Each of the first to fifth interconnection tracks TRC1 to TRC5 may define a disposition position of a corresponding one of the first to fifth lower interconnection lines M1_I1 to M1_I5. For example, the first lower interconnection line M1_I1 may be disposed to be aligned to the first interconnection track TRC1, the second lower interconnection line M1_I2 may be disposed to be aligned to the second interconnection track TRC2, the third lower interconnection line M1_I3 may be disposed to be aligned to the third interconnection track TRC3, the fourth lower interconnection line M1_I4 may be disposed to be aligned to the fourth interconnection track TRC4, and the fifth lower interconnection line M1_I5 may be disposed to be aligned to the fifth interconnection track TRC5.

At least one logic cell may be disposed on the first device region DVR1. In the present specification, the logic cell may mean a logic device (e.g., AND, OR, XOR, XNOR, MUX, inverter, and so forth), which is configured to execute a specific function. In other words, the logic cell may include transistors constituting the logic device and interconnection lines connecting the transistors to each other.

According to an embodiment of the inventive concept, a three-dimensional field effect transistor, in which a gate electrode is disposed to border or at least partially surround a channel pattern three-dimensionally, may be provided on the first and second active patterns AP1 and AP2 of the first device region DVR1. In detail, a transistor on the first device region DVR1 may be a GAAFET or MBCFET, in which a gate electrode is provided to face four surfaces of the channel pattern (e.g., a nanosheet). That is, the first device region DVR1 may be a GAAFET region. The channel pattern of the GAAFET may include a plurality of nanosheets, which are sequentially stacked.

Referring to FIG. 2, a second device region DVR2 may be provided on the substrate 100. In detail, a third power line M1_R3 and a fourth power line M1_R4 may be provided on the substrate 100. The third power line M1_R3 may be a conduction path, to which a drain voltage VDD (e.g., a power voltage) is provided. The fourth power line M1_R4 may be a conduction path, to which a source voltage VSS (e.g., a ground voltage) is provided.

The second device region DVR2 may be defined between the third power line M1_R3 and the fourth power line M1_R4. The second device region DVR2 may include one third active pattern AP3 and one fourth active pattern AP4. For example, the third active pattern AP3 may be a PMOSFET region, and the fourth active pattern AP4 may be an NMOSFET region. The second device region DVR2 may have a CMOS structure that is provided between the third power line M1_R3 and the fourth power line M1_R4.

Each of the third and fourth active patterns AP3 and AP4 may have a second width W2 in the first direction D1. The second width W2 may be smaller than the first width W1 of FIG. 1. A length of the second device region DVR2 in the first direction D1 may be defined as a second height HE2. The second height HE2 may be substantially equal to a distance (e.g., pitch) between the third power line M1_R3 and the fourth power line M1_R4. The second height HE2 may be smaller than the first height HE1 of FIG. 1.

Sixth to eighth interconnection tracks TRC6 to TRC8 may be defined between the third power line M1_R3 and the fourth power line M1_R4. The sixth to eighth interconnection tracks TRC6 to TRC8 may be imaginary lines that extend in the second direction D2 to be parallel to each other. The sixth to eighth interconnection tracks TRC6 to TRC8 may be arranged at a generally constant pitch in the first direction D1. In an embodiment, the pitch of the sixth to eighth interconnection tracks TRC6 to TRC8 may be substantially equal to the pitch of the first to fifth interconnection tracks TRC1 to TRC5 of FIG. 1.

Because the first device region DVR1 previously described with reference to FIG. 1 has a relatively large height HE1, five interconnection tracks may be disposed on the first device region DVR1. However, because the second device region DVR2 of FIG. 2 has a relatively small height HE2, three interconnection tracks may be disposed on the second device region DVR2.

Sixth to eighth lower interconnection lines M1_I6 to M1_I8 may be provided between the third power line M1_R3 and the fourth power line M1_R4. The sixth to eighth lower interconnection lines M1_I6 to M1_I8 may extend in the second direction D2 to be parallel to each other. The third power line M1_R3, the fourth power line M1_R4, and the sixth to eighth lower interconnection lines M1_I6 to M1_I8 may constitute the first metal layer M1.

Each of the sixth to eighth interconnection tracks TRC6 to TRC8 may define a disposition position of a corresponding one of the sixth to eighth lower interconnection lines M1_I6 to M1_I8. For example, the sixth lower interconnection line M1_I6 may be disposed to be aligned to the sixth interconnection track TRC6, the seventh lower interconnection line M1_I7 may be disposed to be aligned to the seventh interconnection track TRC7, and the eighth lower interconnection line M1_I8 may be disposed to be aligned to the eighth interconnection track TRC8.

According to an embodiment of the inventive concept, a three-dimensional field effect transistor, in which a gate electrode is disposed to border and at least partially surround a channel pattern three-dimensionally, may be provided on the third and fourth active patterns AP3 and AP4 of the second device region DVR2. In detail, a transistor on the second device region DVR2 may be a FinFET, in which a gate electrode is provided to face three surfaces of a channel pattern. That is, the second device region DVR2 may be a FinFET region. The channel pattern of the FinFET may include a fin-shaped semiconductor pattern.

The first device region DVR1 may include a GAAFET, which is provided on the first and second active patterns AP1 and AP2 having a relatively large pattern size and has a gate electrode completely surrounding a channel pattern. Due to this structure, the transistor of the first device region DVR1 may have superior performance characteristics and a generally fast operation speed, but may have high power consumption characteristics.

By contrast, the second device region DVR2 may include a FinFET, which is provided on the third and fourth active patterns AP3 and AP4 having a relatively small pattern size and has a gate electrode bordering and at least partially surrounding three surfaces of a channel pattern. Due to this structure, the transistor of the second device region DVR2 may have deficient performance characteristics and a generally low operating speed, compared with the transistor of the first device region DVR1. Nevertheless, the transistor of the second device region DVR2 may be operated with a reduced energy consumption, compared with the transistor of the first device region DVR1.

At least one logic cell may be disposed on the second device region DVR2. A logic cell having a generally fast operation speed may be disposed on the first device region DVR1 of FIG. 1. By contrast, a logic cell having generally low power consumption characteristics may be disposed on the second device region DVR2.

Figure 3:
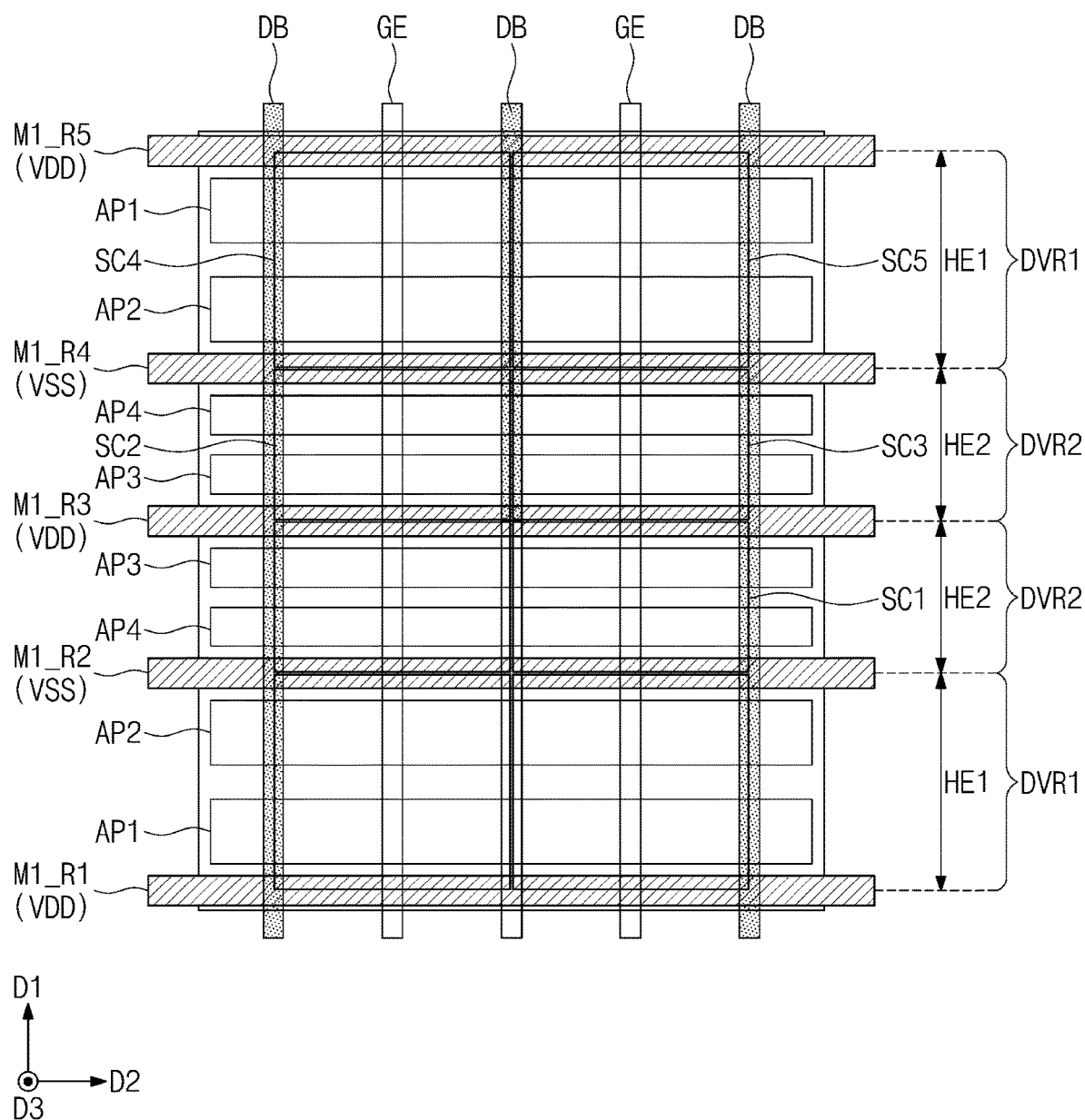
FIG. 3 is a plan view illustrating logic cells, which are two-dimensionally arranged on a substrate according to an embodiment of the inventive concept.

FIG. 3 is a plan view illustrating logic cells, which are two-dimensionally arranged on a substrate according to an embodiment of the inventive concept.

Referring to FIG. 3, the first to fifth power lines M1_R1 to M1_R5 may be disposed on the substrate 100 and may be arranged in the first direction D1. As an example, the drain voltage VDD may be applied to the first, third, and fifth power lines M1_R1, M1_R3, and M1_R5. The source voltage VSS may be applied to the second and fourth power lines M1_R2 and M1_R4.

The first device region DVR1 described with reference to FIG. 1 may be provided between the first and second power lines M1_R1 and M1_R2. The second device region DVR2 described with reference to FIG. 2 may be provided between the second and third power lines M1_R2 and M1_R3. The second device region DVR2 described with reference to FIG. 2 may be provided between the third and fourth power lines M1_R3 and M1_R4. The first device region DVR1 described with reference to FIG. 1 may be provided between the fourth and fifth power lines M1_R4 and M1_R5.

Each of the first device regions DVR1 may constitute a first row parallel to the second direction D2. Each of the second device regions DVR2 may constitute a second row parallel to the second direction D2. Logic cells may be disposed along the first row and in the second direction D2. Logic cells may be disposed along the second row and in the second direction D2.

The first to fifth power lines M1_R1 to M1_R5 may be arranged with different pitch magnitudes in the first direction D1. For example, a pitch between the first and second power lines M1_R1 and M1_R2 may be equal to the first height HE1. A pitch between the second and third power lines M1_R2 and M1_R3 may be equal to the second height HE2.

A plurality of gate electrodes GE may be provided on the substrate 100. The gate electrodes GE may extend in the first direction D1 and may be parallel to each other. A plurality of division structures DB may be provided on the substrate 100. The division structures DB may extend in the first direction D1 and may be parallel to each other. A pitch between the division structure DB and the gate electrode GE adjacent thereto may be substantially equal to a pitch between the gate electrodes GE.

For example, at least one of the division structures DB and at least one of the gate electrodes GE may be aligned to each other in the first direction D1. The division structure DB may define a border between adjacent ones of the logic cells.

A first logic cell SC1 may be provided between the first and third power lines M1_R1 and M1_R3. The first logic cell SC1 may include the first device region DVR1 and the second device region DVR2, which are adjacent to each other in the first direction D1. In other words, the first logic cell SC1 may be a mixed logic cell, in which devices (e.g., GAAFET and FinFET) of different types are provided.

A second logic cell SC2 and a third logic cell SC3 may be provided between the third and fourth power lines M1_R3 and M1_R4. The second logic cell SC2 and the third logic cell SC3 may be adjacent to each other in the second direction D2. The division structure DB may be disposed between the second and third logic cells SC2 and SC3. Each of the second and third logic cells SC2 and SC3 may include the second device region DVR2. In other words, each of the second and third logic cells SC2 and SC3 may be a FinFET-based logic cell.

A fourth logic cell SC4 and a fifth logic cell SC5 may be provided between the fourth and fifth power lines M1_R4 and M1_R5. The fourth logic cell SC4 and the fifth logic cell SC5 may be adjacent to each other in the second direction D2. The division structure DB may be disposed between the fourth and fifth logic cells SC4 and SC5. Each of the fourth and fifth logic cells SC4 and SC5 may include the first device region DVR1. In other words, each of the fourth and fifth logic cells SC4 and SC5 may be a GAAFET-based logic cell.

As described above, the second and third logic cells SC2 and SC3 may be cells in which generally low power consumption characteristics are desired. The fourth and fifth logic cells SC4 and SC5 may be cells in which generally high performance characteristics are desired. The first logic cell SC1 may be a cell having intermediate characteristics between the low power consumption and the high performance.

Figure 4:
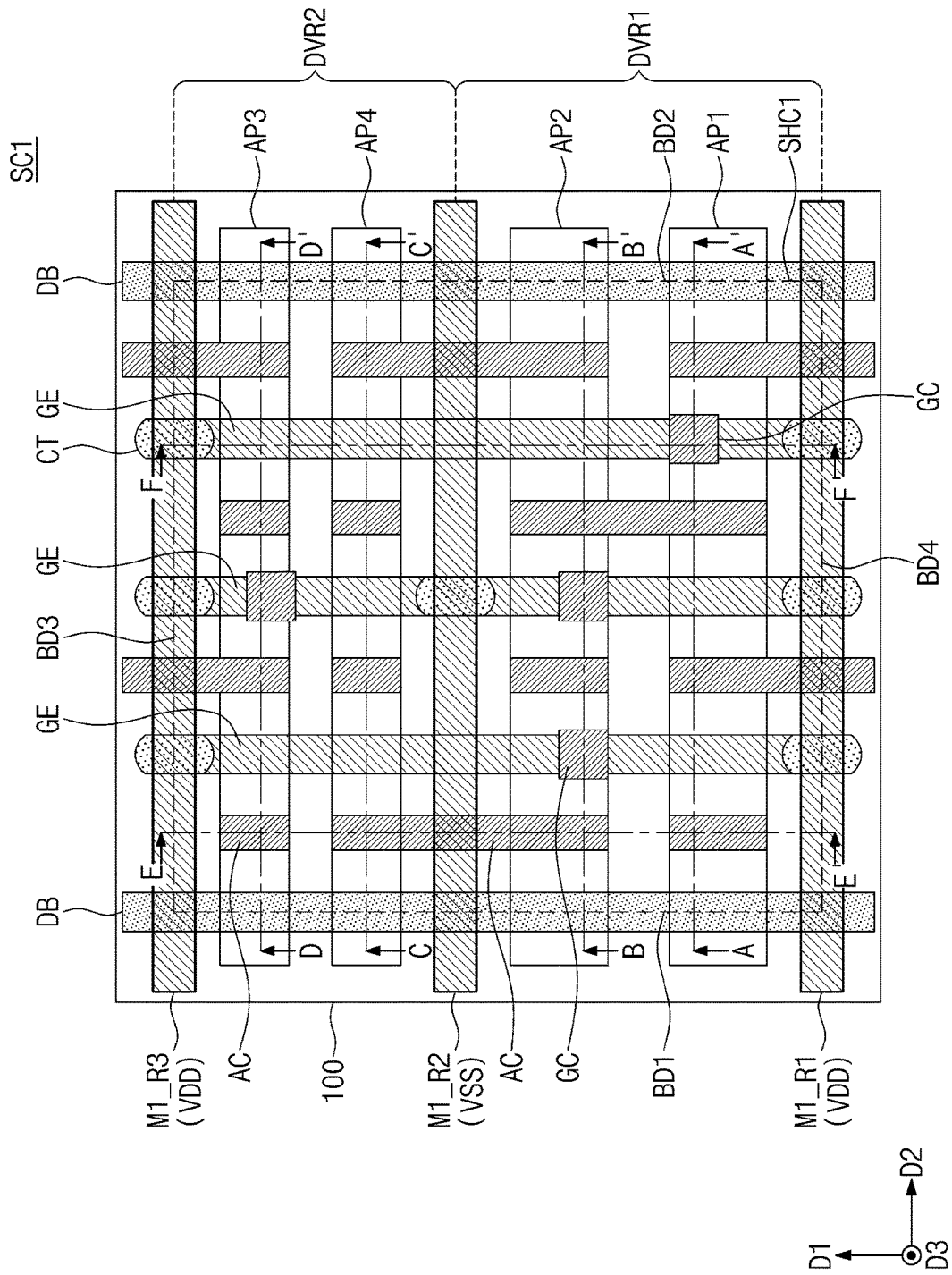
FIG. 4 is a plan view illustrating a semiconductor device according to an embodiment of the inventive concept.

FIG. 4 is a plan view illustrating a semiconductor device according to an embodiment of the inventive concept. FIGS. 5A to 5F are sectional views, which are respectively taken along lines A-A', B-B', C-C', D-D', E-E', and F-F' of FIG. 4. The semiconductor device illustrated in FIGS. 4 and 5A to 5F may be an example of the first logic cell SC1 of FIG. 3.

Referring to FIGS. 4 and 5A to 5F, the first logic cell SC1 may be provided on the substrate 100. Logic transistors constituting a logic circuit may be disposed on the first logic cell SC1. The substrate 100 may be a semiconductor substrate that is formed of or includes silicon, germanium, silicon germanium, a compound semiconductor material, or the like. In an embodiment, the substrate 100 may be a silicon wafer.

The first logic cell SC1 may include the first device region DVR1 and the second device region DVR2. Each of the first and second device regions DVR1 and DVR2 may extend in the second direction D2. The first and second device regions DVR1 and DVR2 may be adjacent to each other in the first direction D1. As previously described with reference to FIGS. 1 and 2, the height HE1 of the first device region DVR1 (e.g., see FIG. 1) may be larger than the height HE2 of the second device region DVR2 (e.g., see FIG. 2).

Hereinafter, the first device region DVR1 will be described in more detail with reference to FIGS. 4, 5A, 5B, 5E, and 5F. The first device region DVR1 may include the first active pattern AP1 and the second active pattern AP2. The first and second active patterns AP1 and AP2 may be defined by a trench TR, which is formed in an upper portion of the substrate 100. The first and second active patterns AP1 and AP2 may extend in the second direction D2. Each of the first and second active patterns AP1 and AP2 may be a vertically-protruding portion of the substrate 100. In an embodiment, the first active pattern AP1 may be a PMOSFET region, and the second active pattern AP2 may be an NMOSFET region.

A device isolation layer ST may be provided to be in and at least partially fill the trench TR. The device isolation layer ST may include a silicon oxide layer. The device isolation layer ST may not be on or cover first and second channel patterns CH1 and CH2 to be described below.

The first channel pattern CH1 may be provided on the first active pattern AP1. The second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, which are sequentially stacked. The first to third semiconductor patterns SP1, SP2, and SP3 may be spaced apart from each other in a vertical direction (i.e., a third direction D3).

Each of the first to third semiconductor patterns SP1, SP2, and SP3 may be formed of or include at least one of silicon (Si), germanium (Ge), and/or silicon germanium (SiGe). For example, each of the first to third semiconductor patterns SP1, SP2, and SP3 may be formed of or include crystalline silicon. Each of the first to third semiconductor patterns SP1, SP2, and SP3 may be a nanosheet.

A plurality of first source/drain patterns SD1 may be provided on the first active pattern AP1. A plurality of first recesses RS1 may be formed in an upper portion of the first active pattern AP1. The first source/drain patterns SD1 may be provided in the first recesses RS1, respectively. The first source/drain patterns SD1 may be impurity regions of a first conductivity type (e.g., p-type). The first channel pattern CH1 may be interposed between each pair of the first source/drain patterns SD1. In other words, each pair of the first source/drain patterns SD1 may be connected to each other by the stacked first to third semiconductor patterns SP1, SP2, and SP3.

A plurality of second source/drain patterns SD2 may be provided on the second active pattern AP2. A plurality of second recesses RS2 may be formed in an upper portion of the second active pattern AP2. The second source/drain patterns SD2 may be provided in the second recesses RS2, respectively. The second source/drain patterns SD2 may be impurity regions of a second conductivity type (e.g., n-type). The second channel pattern CH2 may be interposed between each pair of the second source/drain patterns SD2. In other words, each pair of the second source/drain patterns SD2 may be connected to each other by the stacked first to third semiconductor patterns SP1, SP2, and SP3.

The first and second source/drain patterns SD1 and SD2 may be epitaxial patterns, which are formed by a selective epitaxial growth (SEG) process. In an embodiment, each of the first and second source/drain patterns SD1 and SD2 may have a top surface that is higher than a top surface of the third semiconductor pattern SP3 in the vertical direction (i.e., D3 direction). In another embodiment, a top surface of at least one of the first and second source/drain patterns SD1 and SD2 may be located at substantially the same level as the top surface of the third semiconductor pattern SP3 in the vertical direction (i.e., D3 direction).

The first source/drain patterns SD1 may include a semiconductor material (e.g., SiGe) whose lattice constant is greater than that of the substrate 100. In this case, the pair of the first source/drain patterns SD1 may exert a compressive stress on the first channel patterns CH1 therebetween. The second source/drain patterns SD2 may be formed of or include the same semiconductor element (e.g., Si) as the substrate 100.

Each of the first source/drain patterns SD1 may include a buffer layer BFL and a main layer MAL on the buffer layer BFL. Hereinafter, a sectional shape of the first source/drain pattern SD1 in the second direction D2 will be described in more detail with reference to FIG. 5A.

The buffer layer BFL may be on and at least partially cover an inner surface of the first recess RS1. In an embodiment, the buffer layer BFL may have a decreasing thickness in an upward direction, i.e., D3 direction. For example, a thickness of the buffer layer BFL, which is measured in the third direction D3 on a bottom of the first recess RS1, may be larger than a thickness of the buffer layer BFL, which is measured in the second direction D2 at a top level of the first recess RS1. In addition, the buffer layer BFL may have a 'U'-shaped section corresponding to a profile of the first recess RS1.

The main layer MAL may be in and fill most of an unfilled region of the first recess RS1 covered with the buffer layer BFL. A volume of the main layer MAL may be larger than a volume of the buffer layer BFL. That is, a ratio of the volume of the main layer MAL to a total volume of the first source/drain pattern SD1 may be greater than a ratio of the volume of the buffer layer BFL to the total volume of the first source/drain pattern SD1.

Each of the buffer and main layers BFL and MAL may be formed of or include silicon germanium (SiGe). In detail, the buffer layer BFL may contain a relatively low concentration of germanium (Ge). In another embodiment, the buffer layer BFL may contain only silicon (Si), without germanium (Ge). A germanium concentration of the buffer layer BFL may range from 0 at % to 10 at %. More specifically, the germanium concentration of the buffer layer BFL may range from 2 at % to 8 at %.

The main layer MAL may contain a relatively high concentration of germanium. In an embodiment, the germanium concentration of the main layer MAL may range from 30 at % to 70 at %. The germanium concentration of the main layer MAL may increase in the third direction D3. For example, a portion of the main layer MAL, which is adjacent to the buffer layer BFL, may have a germanium concentration of about 40 at %, and an upper portion of the main layer MAL may have a germanium concentration of about 60 at %.

Each of the buffer and main layers BFL and MAL may contain an impurity (e.g., boron, gallium, and/or indium) that allows the first source/drain pattern SD1 to have a p-type conductivity. The impurity concentration of each of the buffer and main layers BFL and MAL may range from about 1E18 atoms/cm$^3$ to about 5E22 atoms/cm$^3$. The impurity concentration of the main layer MAL may be higher than the impurity concentration of the buffer layer BFL.

The buffer layer BFL may reduce or prevent occurrences of a stacking fault between the substrate 100 (i.e., the first active pattern AP1) and the main layer MAL and between the first to third semiconductor patterns SP1, SP2, and SP3 and the main layer MAL. The stacking fault may lead to an increase of a channel resistance. The stacking fault may easily occur on the bottom of the first recess RS1. According to an embodiment of the inventive concept, the buffer layer BFL may be provided to have a relatively large thickness near the bottom of the first recess RS1, and in this case, it may be possible to reduce or prevent occurrences of the stacking fault.

The buffer layer BFL may protect the main layer MAL during a process of replacing first semiconductor layers SEL1 with first to third portions PO1, PO2, and PO3 of the gate electrode GE, as will be described below. In other words, the buffer layer BFL may inhibit or prevent an etchant material, which is used to remove the first semiconductor layers SEL1, from entering and etching the main layer MAL.

Referring back to FIGS. 4, 5A, 5B, 5E, and 5F, the gate electrodes GE may be provided to cross the first and second channel patterns CH1 and CH2 and to extend in the first direction D1. The gate electrodes GE may be arranged at a first pitch in the second direction D2. Each of the gate electrodes GE may be vertically overlapped with the first and second channel patterns CH1 and CH2.

The gate electrode GE may include a first portion PO1 interposed between the active pattern AP1 or AP2 and the first semiconductor pattern SP1, a second portion PO2 interposed between the first semiconductor pattern SP1 and the second semiconductor pattern SP2, a third portion PO3 interposed between the second semiconductor pattern SP2 and the third semiconductor pattern SP3, and a fourth portion PO4 on the third semiconductor pattern SP3.

Referring back to FIG. 5A, the first to third portions PO1, PO2, and PO3 of the gate electrode GE on the first active pattern AP1 may have different widths from each other. For example, the largest width of the third portion PO3 in the second direction D2 may be larger than the largest width of the second portion PO2 in the second direction D2. The largest width of the first portion PO1 in the second direction D2 may be larger than the largest width of the third portion PO3 in the second direction D2.

Referring back to FIG. 5F, the gate electrode GE may be provided on a first top surface TS1, a first bottom surface BS1, and opposite first side surfaces SW1 of each of the first to third semiconductor patterns SP1, SP2, and SP3. That is, the transistor according to the present embodiment may be a three-dimensional field effect transistor (e.g., MBCFET or GAAFET) in which the gate electrode GE is provided to border or at least partially surround four surfaces of the channel pattern three-dimensionally.

Referring back to FIGS. 4, 5A, 5B, 5E, and 5F, the first logic cell SC1 may have a first border BD1 and a second border BD2, which are opposite to each other in the second direction D2. The first and second borders BD1 and BD2 may extend in the first direction D1. The first logic cell SC1 may have a third border BD3 and a fourth border BD4, which are opposite to each other in the first direction D1. The third and fourth borders BD3 and BD4 may extend in the second direction D2.

Gate cutting patterns CT may be disposed on the third and fourth borders BD3 and BD4. The gate cutting patterns CT may be arranged at the first pitch along the third border BD3. The gate cutting patterns CT may be arranged at the first pitch along the fourth border BD4. When viewed in a plan view, the gate cutting patterns CT on the third and fourth borders BD3 and BD4 may be overlapped with the gate electrodes GE, respectively. The gate cutting patterns CT may be formed of or include one or more insulating materials (e.g., silicon oxide, silicon nitride, or combinations thereof). The gate cutting pattern CT may divide the gate electrode GE extending in the first direction D1 into two gate electrodes GE, which are adjacent to each other in the first direction D1.

A pair of gate spacers GS may be respectively disposed on opposite side surfaces of the fourth portion PO4 of the gate electrode GE. The gate spacers GS may extend along the gate electrode GE and in the first direction D1. Top surfaces of the gate spacers GS may be higher than a top surface of the gate electrode GE in a vertical direction, i.e., D3 direction. The top surfaces of the gate spacers GS may be coplanar with a top surface of a first interlayer insulating layer 110, which will be described below. In an embodiment, the gate spacers GS may be formed of or include at least one of SiCN, SiCON, and/or SiN. In another embodiment, the gate spacers GS may be a multi-layered structure, which is formed of or includes at least two different materials selected from SiCN, SiCON, and SiN.

A gate capping pattern GP may be provided on the gate electrode GE. The gate capping pattern GP may extend along the gate electrode GE or in the first direction D1. The gate capping pattern GP may be formed of or include a material having an etch selectivity with respect to first and second interlayer insulating layers 110 and 120, which will be described below. In detail, the gate capping pattern GP may be formed of or include at least one of SiON, SiCN, SiCON, and/or SiN.

A gate insulating layer GI may be interposed between the gate electrode GE and the first channel pattern CH1 and between the gate electrode GE and the second channel pattern CH2. The gate insulating layer GI may be on and at least partially cover the first top surface TS1, the first bottom surface BS1, and the opposite first side surfaces SW1 of each of the first to third semiconductor patterns SP1, SP2, and SP3. The gate insulating layer GI may be on and at least partially cover a top surface of the device isolation layer ST below the gate electrode GE.

In an embodiment, the gate insulating layer GI may include a silicon oxide layer, a silicon oxynitride layer, and/or a high-k dielectric layer. In an embodiment, the gate insulating layer GI may be a multiple layer including a silicon oxide layer and a high-k dielectric layer. The high-k dielectric layer may be formed of or include one or more high-k dielectric materials whose dielectric constants are higher than that of silicon oxide. For example, the high-k dielectric material may include one or more of hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and/or lead zinc niobate.

The gate electrode GE may include a first metal pattern and a second metal pattern on the first metal pattern. The first metal pattern may be provided on the gate insulating layer GI and may be adjacent to the first to third semiconductor patterns SP1, SP2, and SP3. The first metal pattern may include a work-function metal, which can be used to adjust a threshold voltage of the transistor. By adjusting a thickness and composition of the first metal pattern, it may be possible to realize a transistor having a desired threshold voltage. For example, the first to third portions PO1, PO2, and PO3 of the gate electrode GE may be composed of the first metal pattern or the work-function metal.

The first metal pattern may include a metal nitride layer. For example, the first metal pattern may include a layer that is composed of at least one metallic material, which is selected from the group consisting of titanium (Ti), tantalum (Ta), aluminum (Al), tungsten (W) and molybdenum (Mo), and nitrogen (N). In an embodiment, the first metal pattern may further include carbon (C). The first metal pattern may include a plurality of work function metal layers which are stacked.

The second metal pattern may be formed of or include a metallic material whose resistance is lower than the first metal pattern. For example, the second metal pattern may be formed of or include at least one metallic material, which is selected from the group consisting of tungsten (W), aluminum (Al), titanium (Ti), and tantalum (Ta). The fourth portion PO4 of the gate electrode GE may include the first metal pattern and the second metal pattern on the first metal pattern.

Referring back to FIG. 5B, inner spacers IP may be provided on the second active pattern AP2. The inner spacers IP may be respectively interposed between the first to third portions PO1, PO2, and PO3 of the gate electrode GE and the second source/drain pattern SD2. The inner spacers IP may be in direct contact with the second source/drain pattern SD2. Each of the first to third portions PO1, PO2, and PO3 of the gate electrode GE may be spaced apart from the second source/drain pattern SD2 by the inner spacer IP.

Hereinafter, the second device region DVR2 will be described in more detail with reference to FIGS. 4, 5C, 5D, 5E, and 5F. The second device region DVR2 may include the third active pattern AP3 and the fourth active pattern AP4. The third and fourth active patterns AP3 and AP4 may be defined by the trench TR, which is formed in an upper portion of the substrate 100. The device isolation layer ST may be provided to at least partially fill the trench TR. The device isolation layer ST may not be on or cover third and fourth channel patterns CH3 and CH4 to be described below.

The third and fourth active patterns AP3 and AP4 may extend in the second direction D2. The third and fourth active patterns AP3 and AP4 may be vertically protruding portions of the substrate 100. In an embodiment, the third active pattern AP3 may be a PMOSFET region, and the fourth active pattern AP4 may be an NMOSFET region. A width of each of the third and fourth active patterns AP3 and AP4 in the first direction D1 may be smaller than a width of each of the first and second active patterns AP1 and AP2 in the first direction D1.

A third channel pattern CH3 may be provided on the third active pattern AP3. A fourth channel pattern CH4 may be provided on the fourth active pattern AP4. Each of the third and fourth channel patterns CH3 and CH4 may include the first and second semiconductor layers SEL1 and SEL2, which are alternately stacked. For example, the second semiconductor layer SEL2 may be interposed between adjacent ones of the first semiconductor layers SEL1. The first semiconductor layer SEL1 may be interposed between adjacent ones of the second semiconductor layers SEL2.

The first semiconductor layers SEL1 may be formed of or include one or more of silicon (Si), germanium (Ge), and/or silicon-germanium (SiGe). The second semiconductor layers SEL2 may also be formed of or include one or more of silicon (Si), germanium (Ge), and/or silicon-germanium (SiGe), but the semiconductor materials of the first and second semiconductor layers SEL1 and SEL2 may be different from each other. The second semiconductor layers SEL2 may be formed of or include the same material as the first to third semiconductor patterns SP1 to SP3 of the first and second channel patterns CH1 and CH2. For example, the first semiconductor layers SEL1 may be formed of or include silicon-germanium (SiGe), and the second semiconductor layers SEL2 may be formed of or include silicon (Si).

Figure 5A:
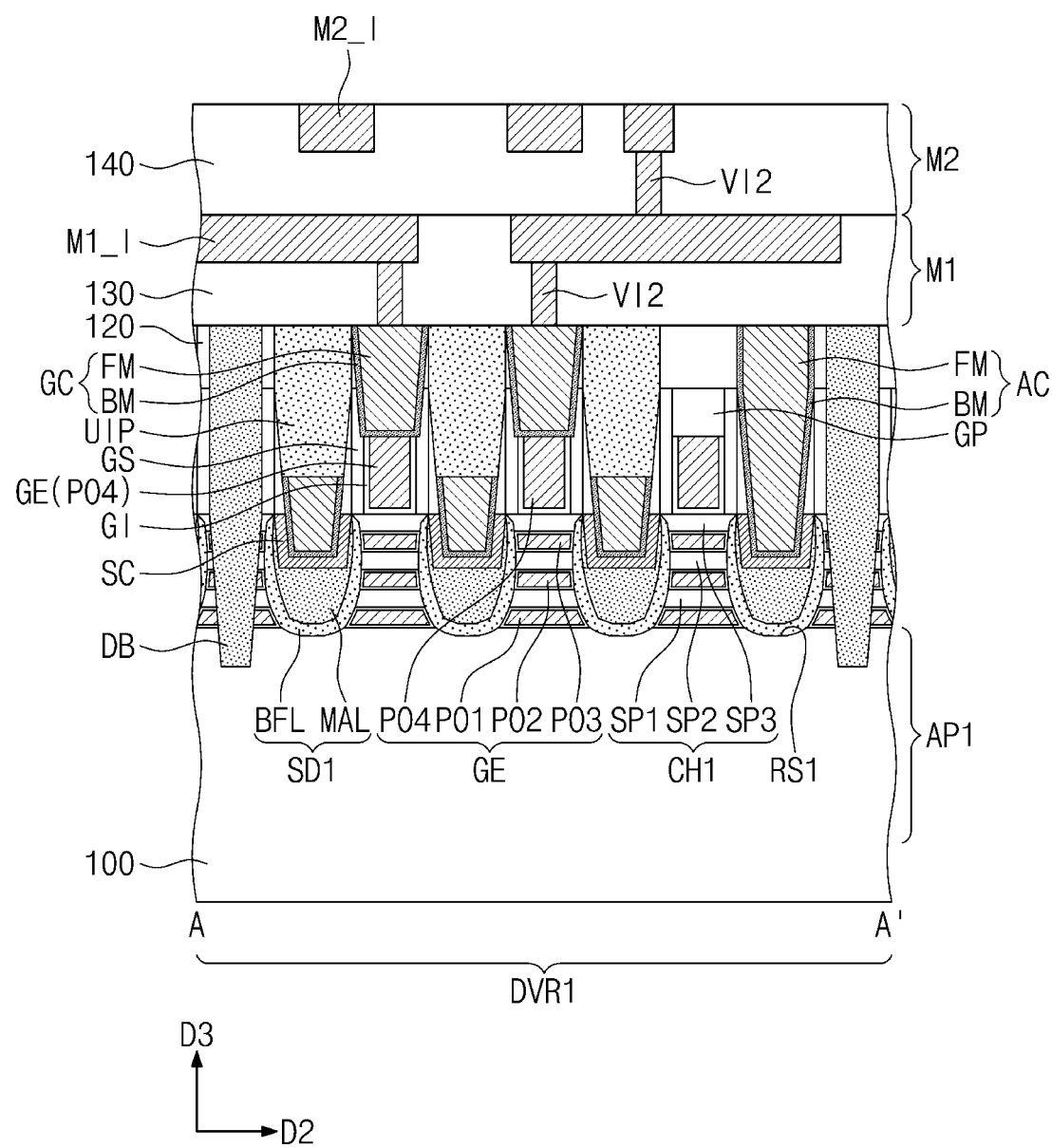
FIGS. 5A to 5F are sectional views, which are respectively taken along lines A-A', B-B', C-C', D-D', E-E', and F-F' of FIG. 4.
Figure 5B:
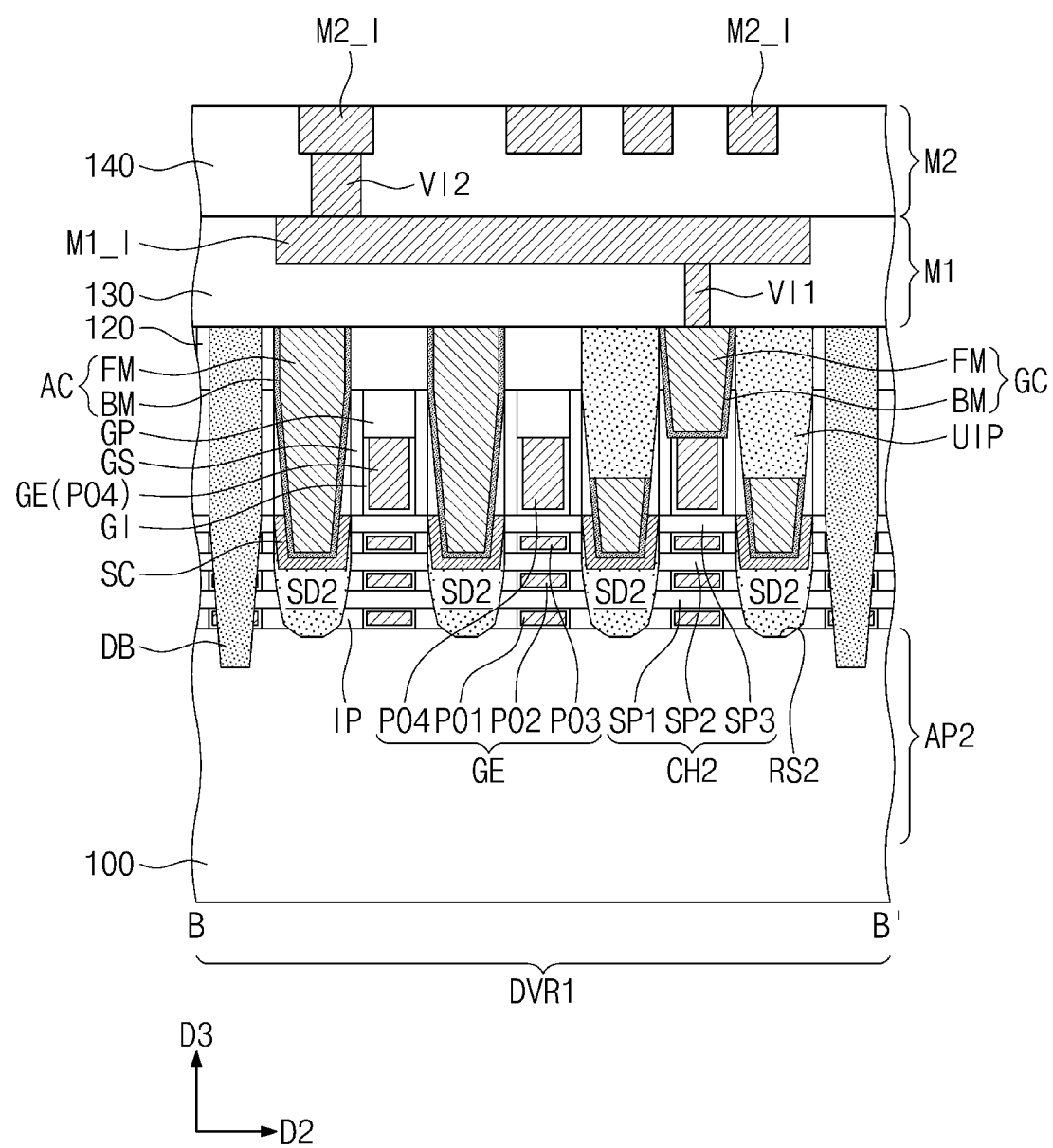
Figure 5C:
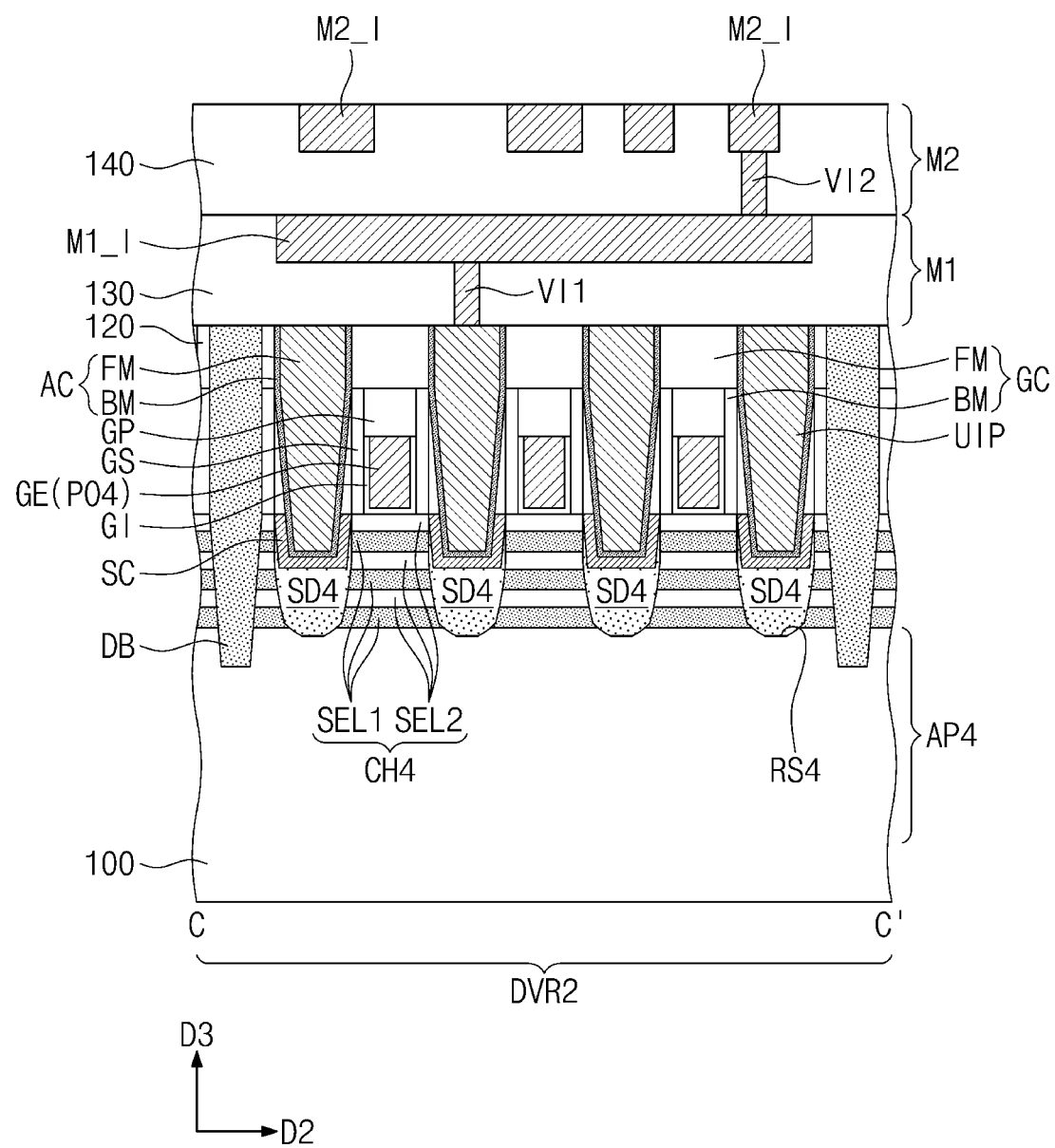
Figure 5D:
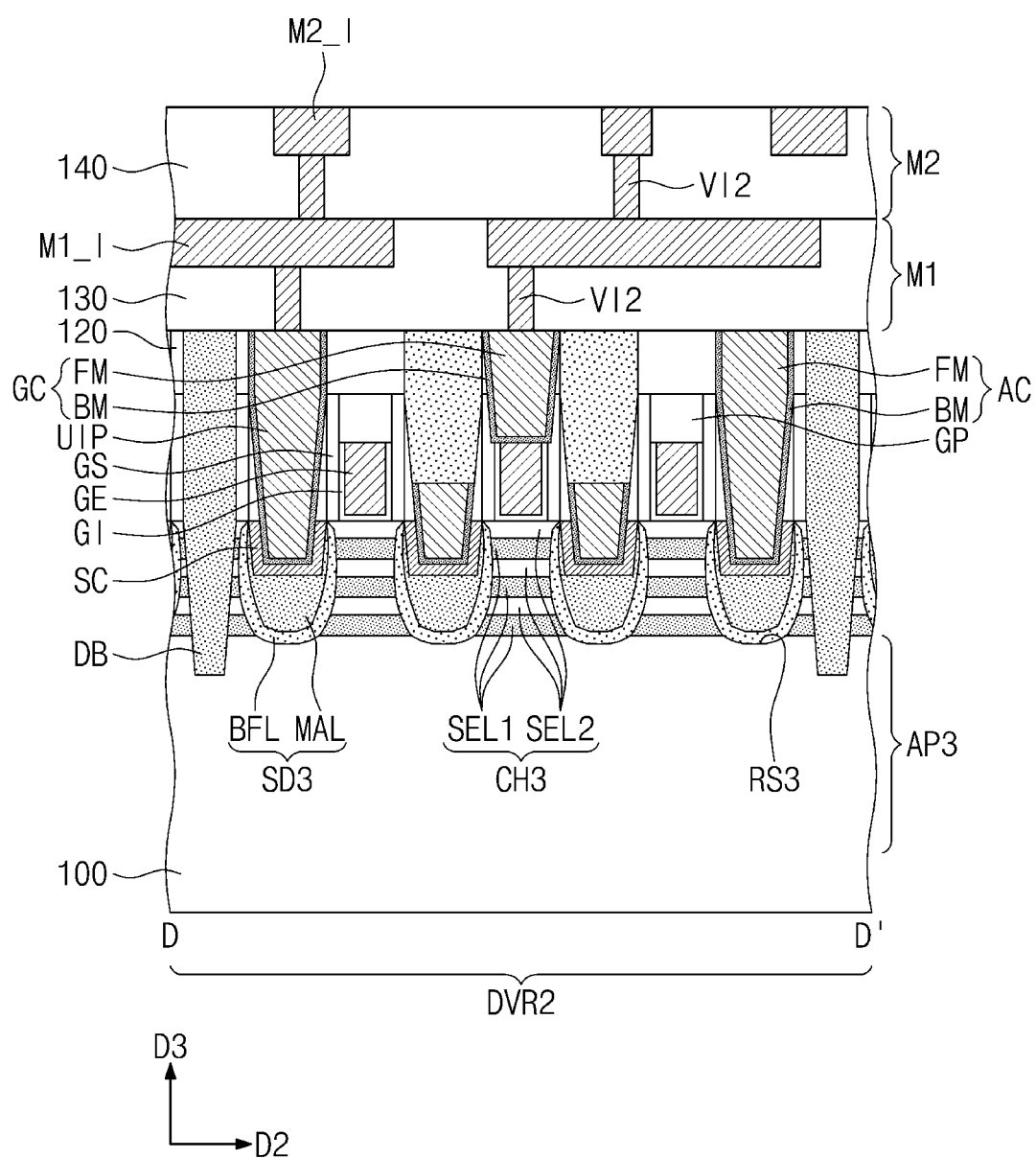
Figure 5E:
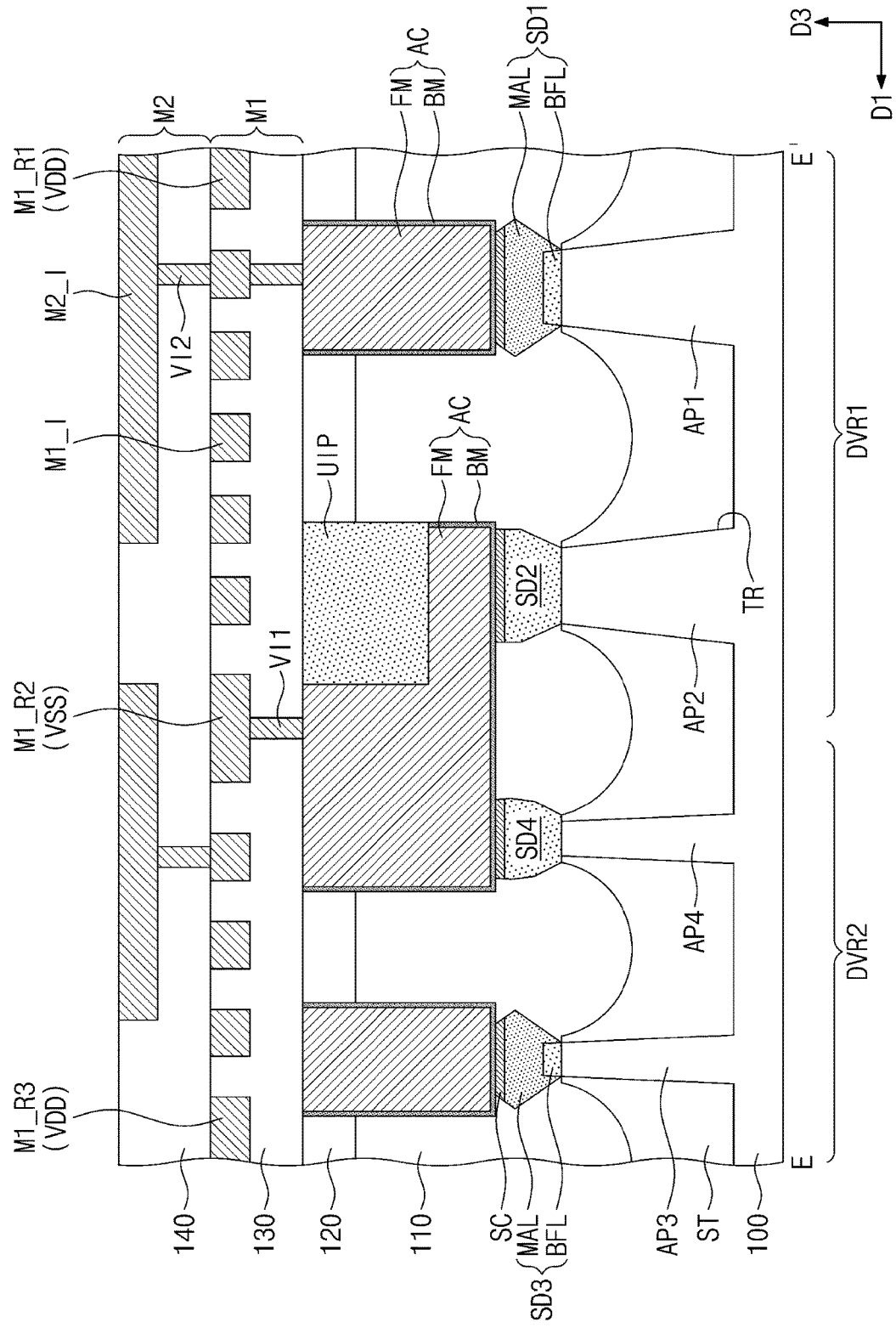
Figure 5F:
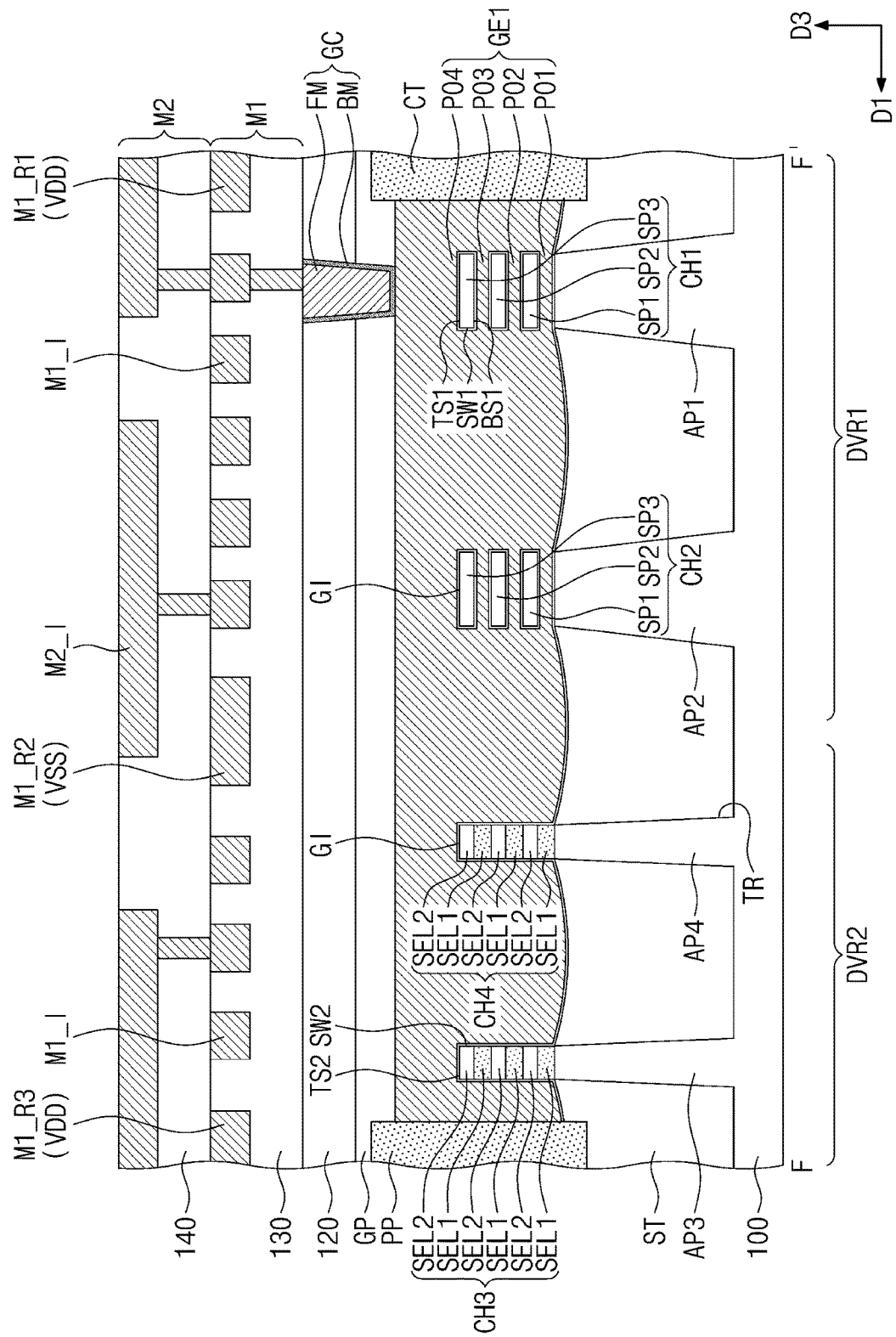

Referring to FIG. 5F, the second semiconductor layers SEL2 of each of the third and fourth channel pattern CH3 and CH4 may be located at the same level (or height) in the D3 direction as corresponding ones of the first to third semiconductor patterns SP1 to SP3 on the first device region DVR1. A width of each of the third and fourth channel pattern CH3 and CH4 may be smaller than a width the first to third semiconductor patterns SP1 to SP3 arranged on the first device region DVR1. The first semiconductor layers SEL1 of each of the third and fourth channel pattern CH3 and CH4 may be located at the same level (or height) in the D3 direction as corresponding ones of the first to third portions PO1 to PO3 of the gate electrode GE on the first device region DVR1.

A plurality of third source/drain patterns SD3 may be provided on the third active pattern AP3. A plurality of third recesses RS3 may be formed in an upper portion of the third active pattern AP3. The third source/drain patterns SD3 may be provided in the third recesses RS3, respectively. The third source/drain patterns SD3 may be impurity regions of a first conductivity type (e.g., p-type). The third channel pattern CH3 may be interposed between a pair of third source/drain patterns SD3. In other words, the pair of third source/drain patterns SD3 may be connected to each other by the first and second semiconductor layers SEL1 and SEL2 stacked.

A plurality of fourth source/drain patterns SD4 may be provided on the fourth active pattern AP4. A plurality of fourth recesses RS4 may be formed in an upper portion of the fourth active pattern AP4. The fourth source/drain patterns SD4 may be provided in the fourth recesses RS4, respectively. The fourth source/drain patterns SD4 may be impurity regions of a second conductivity type (e.g., n-type). The fourth channel pattern CH4 may be interposed between a pair of fourth source/drain patterns SD4. In other words, the pair of fourth source/drain patterns SD4 may be connected to each other by the first and second semiconductor layers SEL1 and SEL2 stacked.

Referring back to FIG. 5E, the largest width of the third source/drain pattern SD3 in the first direction D1 may be smaller than the largest width of the first source/drain pattern SD1 in the first direction D1. The largest width of the fourth source/drain pattern SD4 in the first direction D1 may be smaller than the largest width of the second source/drain pattern SD2 in the first direction D1. This is because a width of each of the third and fourth active patterns AP3 and AP4 is smaller than a width of each of the first and second active patterns AP1 and AP2 in the first direction D1.

The third and fourth source/drain patterns SD3 and SD4 may be epitaxial patterns, which are formed by a selective epitaxial growth (SEG) process. The third and fourth source/drain patterns SD3 and SD4 may be configured to have substantially the same features as the first and second source/drain patterns SD1 and SD2 described above.

The gate electrodes GE may be provided to cross not only the first and second channel patterns CH1 and CH2 but also the third and fourth channel patterns CH3 and CH4. Referring back to FIG. 5F, the gate electrode GE may extend from the first channel pattern CH1 to the fourth channel pattern CH4 via the second and third channel patterns CH2 and CH3 in the first direction D1. In other words, the first and second device regions DVR1 and DVR2 may share at least one of the gate electrodes GE.

A width of the gate electrode GE on the first device region DVR1 in the second direction D2 may be substantially equal to a width of the gate electrode GE on the second device region DVR2 in the second direction D2. A pitch between the gate electrodes GE on the second device region DVR2 may be substantially equal to the first pitch between the gate electrodes GE on the first device region DVR1.

The gate electrode GE may be provided on a second top surface TS2 and opposite second side surfaces SW2 of each of the third and fourth channel patterns CH3 and CH4. That is, the transistor according to the present embodiment may be a three-dimensional field effect transistor (e.g., FinFET) in which the gate electrode GE is provided to face three surfaces of the channel pattern three-dimensionally.

According to an embodiment of the inventive concept, transistors of different types (i.e., GAAFET of FinFET) may be provided together within a single logic cell. As illustrated in FIG. 5F, the transistors of different types may share one of the gate electrodes GE. As illustrated in FIG. 5E, the transistors of different types may share one active contact AC. In detail, one active contact AC may be connected in common to the second source/drain pattern SD2 of the GAAFET and the fourth source/drain pattern SD4 of the FinFET.

Referring back to FIGS. 4 and 5A to 5F, a first interlayer insulating layer 110 may be provided on the substrate 100. The first interlayer insulating layer 110 may be on and at least partially cover the gate spacers GS and first to fourth source/drain patterns SD1 to SD4. The first interlayer insulating layer 110 may have a top surface that is substantially coplanar with the top surface of the gate capping pattern GP and the top surface of the gate spacer GS. A second interlayer insulating layer 120 may be formed on the first interlayer insulating layer 110 to be on and at least partially cover the gate capping pattern GP. A third interlayer insulating layer 130 may be provided on the second interlayer insulating layer 120. A fourth interlayer insulating layer 140 may be provided on the third interlayer insulating layer 130. In an embodiment, at least one of the first to fourth interlayer insulating layers 110 to 140 may include a silicon oxide layer.

A pair of division structures DB may be respectively provided at both sides of the first logic cell SC1. The pair of division structures DB may be provided on the first and second borders BD1 and BD2, respectively, of the first logic cell SC1. The division structure DB may extend in the first direction D1 and parallel to the gate electrodes GE. A pitch between the division structure DB and the gate electrode GE adjacent thereto may be equal to the first pitch.

The division structure DB may be provided to penetrate the first and second interlayer insulating layers 110 and 120 and may extend into the first and second active patterns AP1 and AP2. The division structure DB may be provided to penetrate an upper portion of each of the first and second active patterns AP1 and AP2. The division structure DB may electrically separate an active pattern of the first logic cell SC1 from active patterns of other cells adjacent thereto.

The active contacts AC may be provided to penetrate the first and second interlayer insulating layers 110 and 120 and to be electrically connected to the first to fourth source/drain patterns SD1 to SD4, respectively. A pair of the active contacts AC may be respectively provided at both sides of the gate electrode GE. When viewed in a plan view, the active contact AC may be a bar-shaped pattern that extends in the first direction D1.

The active contact AC may be a self-aligned contact. For example, the active contact AC may be formed by a self-alignment process using the gate capping pattern GP and the gate spacer GS. For example, the active contact AC may be on and at least partially cover at least a portion of the side surface of the gate spacer GS. Although not shown, the active contact AC may be on and at least partially cover a portion of the top surface of the gate capping pattern GP.

A metal-semiconductor compound layer SC (e.g., a silicide layer) may be interposed between the active contact AC and each of the first to fourth source/drain patterns SD1 to SD4. The active contact AC may be electrically connected to the source/drain pattern SD1 to SD4 via the metal-semiconductor compound layer SC. For example, the metal-semiconductor compound layer SC may be formed of or include one or more of titanium silicide, tantalum silicide, tungsten silicide, nickel silicide, and/or cobalt silicide.

Gate contacts GC may be provided to penetrate the second interlayer insulating layer 120 and the gate capping pattern GP and to be electrically connected to the gate electrodes GE, respectively. When viewed in a plan view, at least one of the gate contacts GC may be overlapped with one of the first to fourth active patterns AP1 to AP4. For example, as illustrated in FIG. 5A, two gate contacts GC may be provided on the first active pattern AP1 (e.g., see FIG. 5A). The gate contact GC may be freely disposed on the gate electrode GE, without any limitation in its position.

In an embodiment, referring to FIGS. 5A, 5B, and 5C, an upper portion of the active contact AC adjacent to the gate contact GC may be at least partially filled with an upper insulating pattern UIP. A bottom surface of the upper insulating pattern UIP may be lower than a bottom surface of the gate contact GC in the D3 direction. In other words, a top surface of the active contact AC adjacent to the gate contact GC may be formed at a level, which is lower in the D3 direction than the bottom surface of the gate contact GC, by the upper insulating pattern UIP. In this case, it may be possible to prevent the gate contact GC and the active contact AC, which are adjacent to each other, from being in contact with each other and thereby to prevent a short circuit from occurring therebetween.

Each of the active and gate contacts AC and GC may include a conductive pattern FM and a barrier pattern BM at least partially enclosing the conductive pattern FM. For example, the conductive pattern FM may be formed of or include one or more metallic materials (e.g., aluminum, copper, tungsten, molybdenum, and/or cobalt). The barrier pattern BM may be provided to be on and at least partially cover side and bottom surfaces of the conductive pattern FM. In an embodiment, the barrier pattern BM may include a metal layer and a metal nitride layer. The metal layer may be formed of or include one or more of titanium, tantalum, tungsten, nickel, cobalt, and/or platinum. The metal nitride layer may be formed of or include one or more of titanium nitride (TiN), tantalum nitride (TaN), tungsten nitride (WN), nickel nitride (NiN), cobalt nitride (CoN), and/or platinum nitride (PtN).

The first metal layer M1 may be provided in the third interlayer insulating layer 130. For example, the first metal layer M1 may include the first power line M1_R1, the second power line M1_R2, the third power line M1_R3, and lower interconnection lines MU. The interconnection lines M1_R1, M1_R2, M1_R3, and M1_I of the first metal layer M1 may extend in the second direction D2 to be parallel to each other.

The first power line M1_R1 may be provided on the fourth border BD4 of the first logic cell SC1. The third power line M1_R3 may be provided on the third border BD3 of the first logic cell SC1. The first to third power lines M1_R1 to M1_R3 may extend in the second direction D2 to be parallel to each other. The first device region DVR1 may be disposed between the first and second power lines M1_R1 and M1_R2. The second device region DVR2 may be disposed between the second and third power lines M1_R2 and M1_R3.

As previously described with reference to FIG. 1, five interconnection tracks may be provided on the first device region DVR1. In this case, a maximum of five lower interconnection lines M1_I may be disposed between the first and second power lines M1_R1 and M1_R2. As previously described with reference to FIG. 2, three interconnection tracks may be provided on the second device region DVR2. In this case, a maximum of three lower interconnection lines M1_I may be disposed between the second and third power lines M1_R2 and M1_R3.

The lower interconnection lines M1_I of the first metal layer M1 may be arranged at a second pitch in the first direction D1. A linewidth of each of the lower interconnection lines M1_I may be smaller than a linewidth of each of the first to third power lines M1_R1, M1_R2, and M1_R3.

The first metal layer M1 may further include first vias VI1. The first vias VI1 may be respectively provided below the interconnection lines M1_R1, M1_R2, M1_R3, and M1_I of the first metal layer M1. The active contact AC and the interconnection line of the first metal layer M1 may be electrically connected to each other through the first via VI1. The gate contact GC and the interconnection line of the first metal layer M1 may be electrically connected to each other through the first via VI1.

The interconnection line of the first metal layer M1 and the first via VI1 thereunder may be formed by separate processes. For example, the interconnection line and the first via VI1 of the first metal layer M1 may be independently formed by respective single damascene processes. The semiconductor device according to the present embodiment may be fabricated using a sub-20 nm process.

A second metal layer M2 may be provided in the fourth interlayer insulating layer 140. The second metal layer M2 may include a plurality of upper interconnection lines M2_I. Each of the upper interconnection lines M2_I of the second metal layer M2 may be a line- or bar-shaped pattern extending in the first direction D1. In other words, the upper interconnection lines M2_I may extend in the first direction D1 to be parallel to each other.

The second metal layer M2 may further include second vias VI2, which are respectively provided below the upper interconnection lines M2_I. The interconnection lines of the first and second metal layers M1 and M2 may be electrically connected to each other through the second via VI2. The interconnection line of the second metal layer M2 and the second via VI2 thereunder may be formed together by a dual damascene process.

The interconnection lines of the first metal layer M1 may be formed of or include a conductive material that is the same as or different from those of the second metal layer M2. For example, the interconnection lines of the first and second metal layers M1 and M2 may be formed of or include one or more metallic materials (e.g., copper, ruthenium, aluminum, tungsten, molybdenum, and/or cobalt). Although not shown, a plurality of metal layers (e.g., M3, M4, M5, and so forth) may be additionally stacked on the fourth interlayer insulating layer 140. Each of the stacked metal layers may include interconnection lines, which are used as routing paths between cells.

Referring back to FIG. 3, each of the second and third logic cells SC2 and SC3 may be composed of only the second device region DVR2 illustrated in FIGS. 5C, 5D, 5E, and 5F. Each of the fourth and fifth logic cells SC4 and SC5 may be composed of only the first device region DVR1 illustrated in FIGS. 5A, 5B, 5E, and 5F.

According to an embodiment of the inventive concept, the first device region DVR1 may be provided to have a relatively large effective gate width (e.g., a sum of lengths of surfaces TS1, BS1, and SW1 of FIG. 5F). By contrast, the second device region DVR2 may have a relatively small effective gate width (e.g., a sum of lengths of surfaces TS2 and SW2 of FIG. 5F). Although the first device region DVR1 can be operated with generally high performance, it may have generally higher power consumption characteristics. Although the second device region DVR2 can be operated with generally low power consumption, its performance may be below a desired level. According to an embodiment of the inventive concept, each of the first and second device regions DVR1 and DVR2, alone or a combination thereof, may be used to form a logic cell, and thus, it may be possible to realize a transistor structure optimized for each logic cell.

FIGS. 6A to 11E are sectional views illustrating a method of fabricating a semiconductor device, according to an embodiment of the inventive concept. In detail, FIGS. 6A, 7A, 8A, 9A, 10A, and 11A are sectional views corresponding to the line A-A' of FIG. 4. FIGS. 8B, 9B, 10B, and 11B are sectional views corresponding to the line B-B' of FIG. 4. FIGS. 8C, 9C, 10C, and 11C are sectional views corresponding to the line C-C' of FIG. 4. FIGS. 6B, 7B, 8D, 9D, 10D, and 11D are sectional views corresponding to the line D-D' of FIG. 4. FIGS. 8E and 9E are sectional views corresponding to the line E-E' of FIG. 4. FIGS. 6C, 7C, 10E, and 11E are sectional views corresponding to the line F-F' of FIG. 4.

Figure 6A:
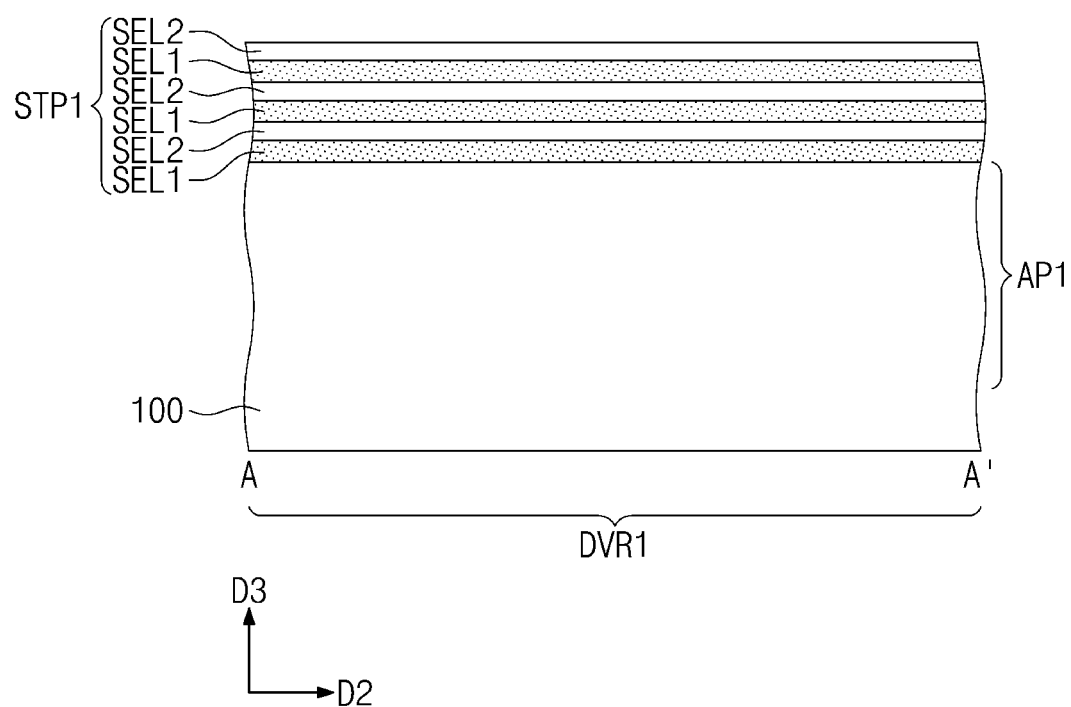
FIGS. 6A to 11E are sectional views illustrating a method of fabricating a semiconductor device, according to an embodiment of the inventive concept.
Figure 6B:
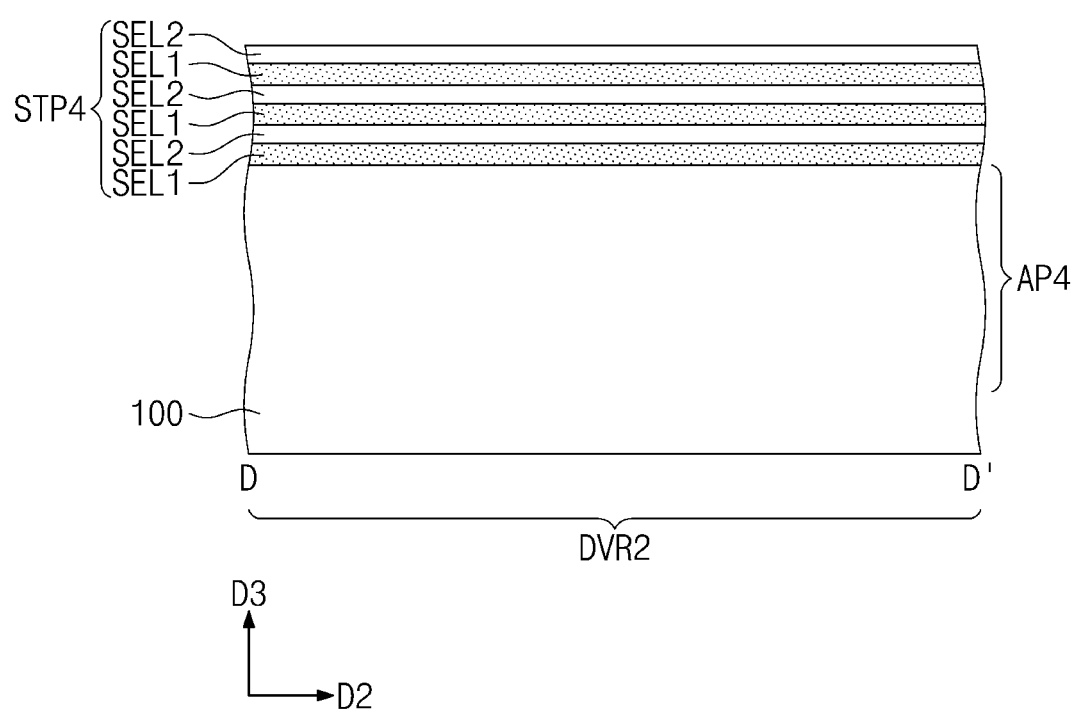
Figure 6C:
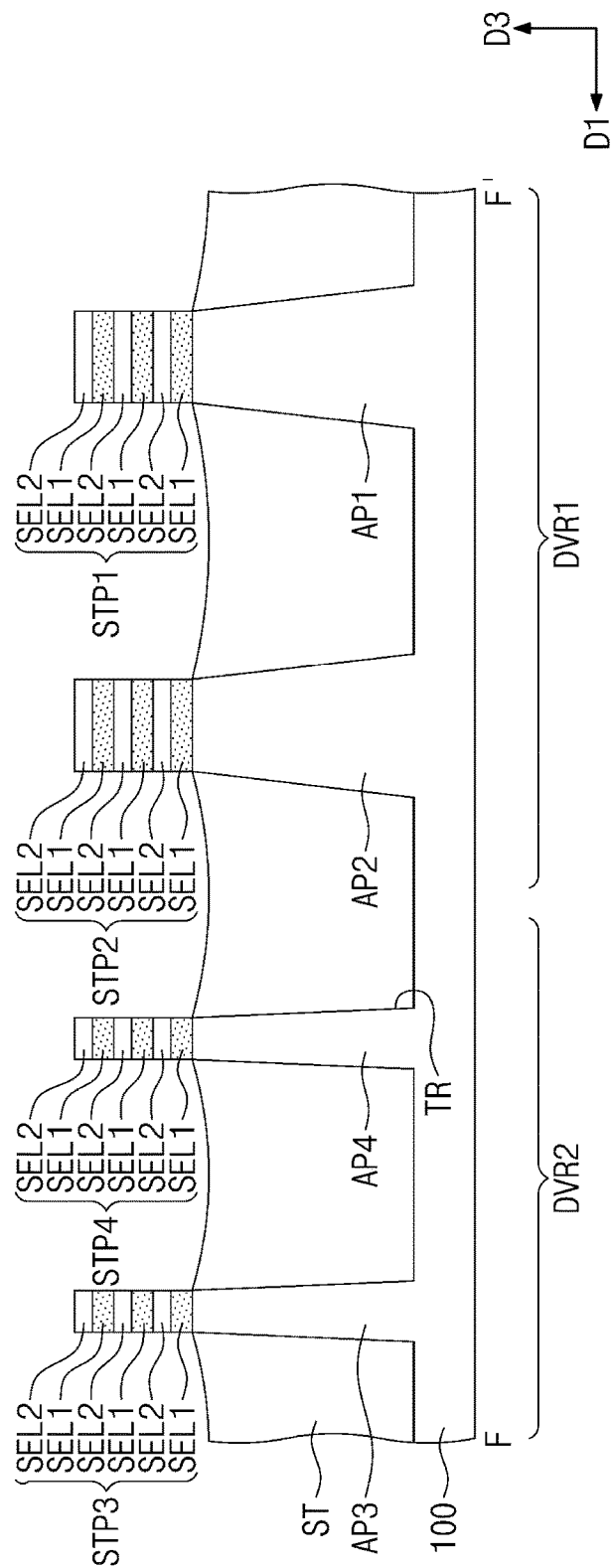

Referring to FIGS. 6A to 6C, the substrate 100 including the first and second device regions DVR1 and DVR2 may be provided. The first and second semiconductor layers SEL1 and SEL2, which are alternately stacked on top of each other, may be formed on the substrate 100. Each of the first and second semiconductor layers SEL1 and SEL2 may be formed of or include one or more of silicon (Si), germanium (Ge), and/or silicon-germanium (SiGe), and in an embodiment, the materials of the first and second semiconductor layers SEL1 and SEL2 may be different from each other.

The first semiconductor layer SEL1 may be formed of or include a material having an etch selectivity with respect to the second semiconductor layer SEL2. For example, the first semiconductor layers SEL1 may be formed of or include silicon-germanium (SiGe), and the second semiconductor layers SEL2 may be formed of or include silicon (Si). A germanium concentration of each of the first semiconductor layers SEL1 may range from about 10 at % to about 30 at %.

Mask patterns may be formed on each of the first and second device regions DVR1 and DVR2. Each of the mask patterns may be a line- or bar-shaped pattern extending in the second direction D2.

The trench TR defining the first to fourth active patterns AP1 to AP4 may be formed by performing a patterning process using the mask patterns as an etch mask. The first and second active patterns AP1 and AP2 may be formed on the first device region DVR1. The third and fourth active patterns AP3 and AP4 may be formed on the second device region DVR2.

First to fourth stacking patterns STP1 to STP4 may be formed on the first to fourth active patterns AP1 to AP4, respectively. Each of the first to fourth stacking patterns STP1 to STP4 may include the first and second semiconductor layers SEL1 and SEL2, which are alternately stacked on top of each other. The first to fourth stacking patterns STP1 to STP4, along with the first to fourth active patterns AP1 to AP4, may be formed during the patterning process.

The device isolation layer ST may be formed to at least partially fill the trench TR. In detail, an insulating layer may be formed on the substrate 100 to be on and at least partially cover the first to fourth active patterns AP1 to AP4 and the first to fourth stacking patterns STP1 to STP4. The device isolation layer ST may be formed by recessing the insulating layer to expose the first to fourth stacking patterns STP1 to STP4.

The device isolation layer ST may be formed of or include one or more insulating materials (e.g., silicon oxide). The first to fourth stacking patterns STP1 to STP4 may be placed above the device isolation layer ST and may be exposed to the outside of the device isolation layer ST. In other words, the first to fourth stacking patterns STP1 to STP4 may protrude vertically (i.e., in the D3 direction) above the device isolation layer ST.

Figure 7A:
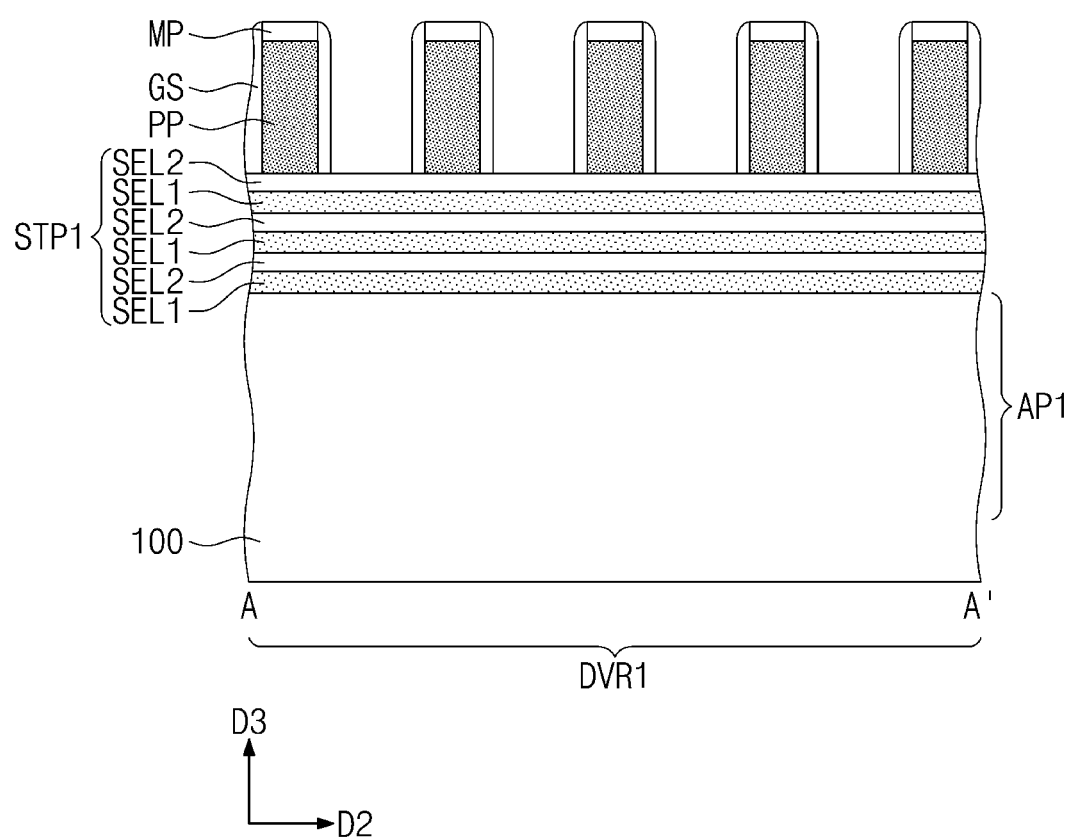
Figure 7B:
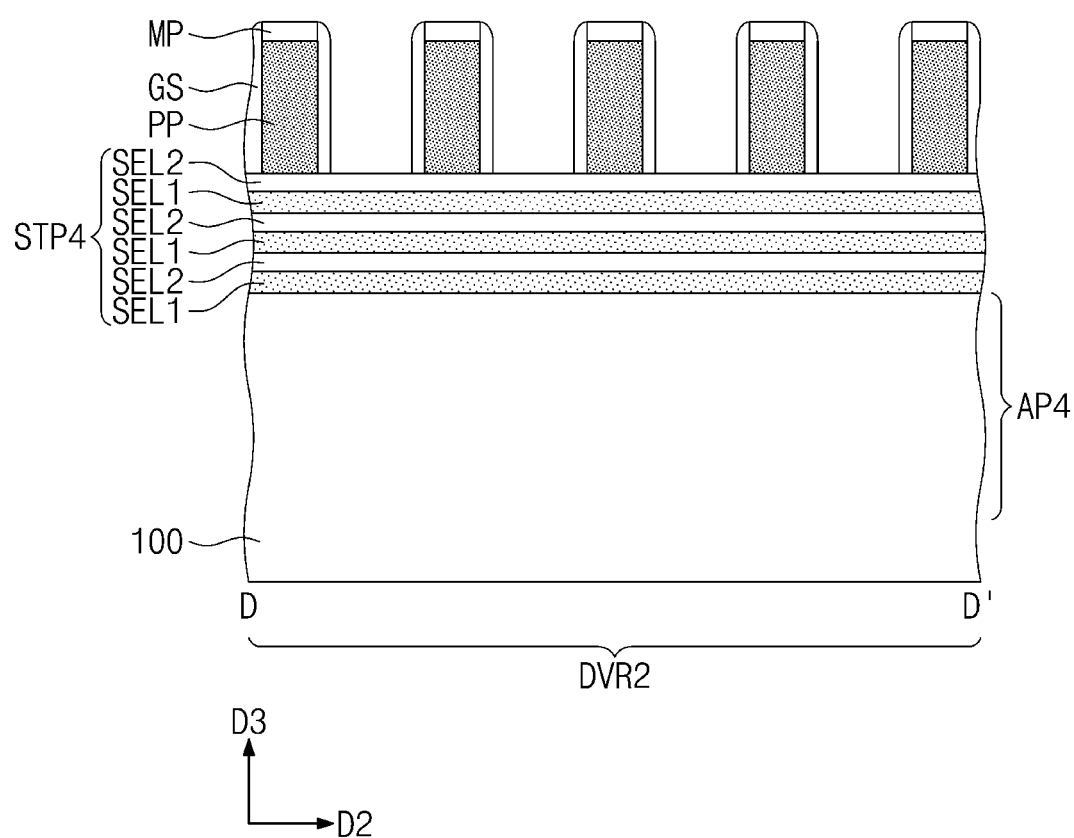
Figure 7C:
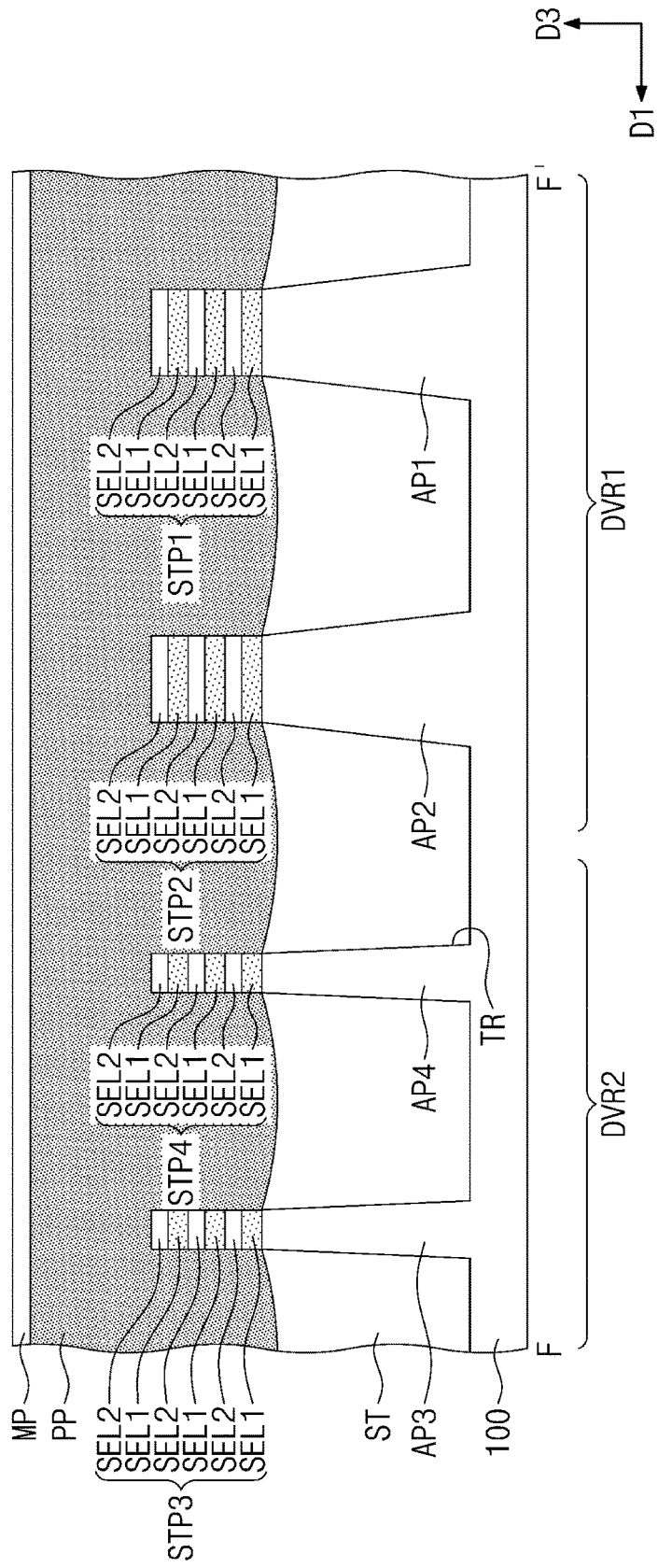
Figure 8A:
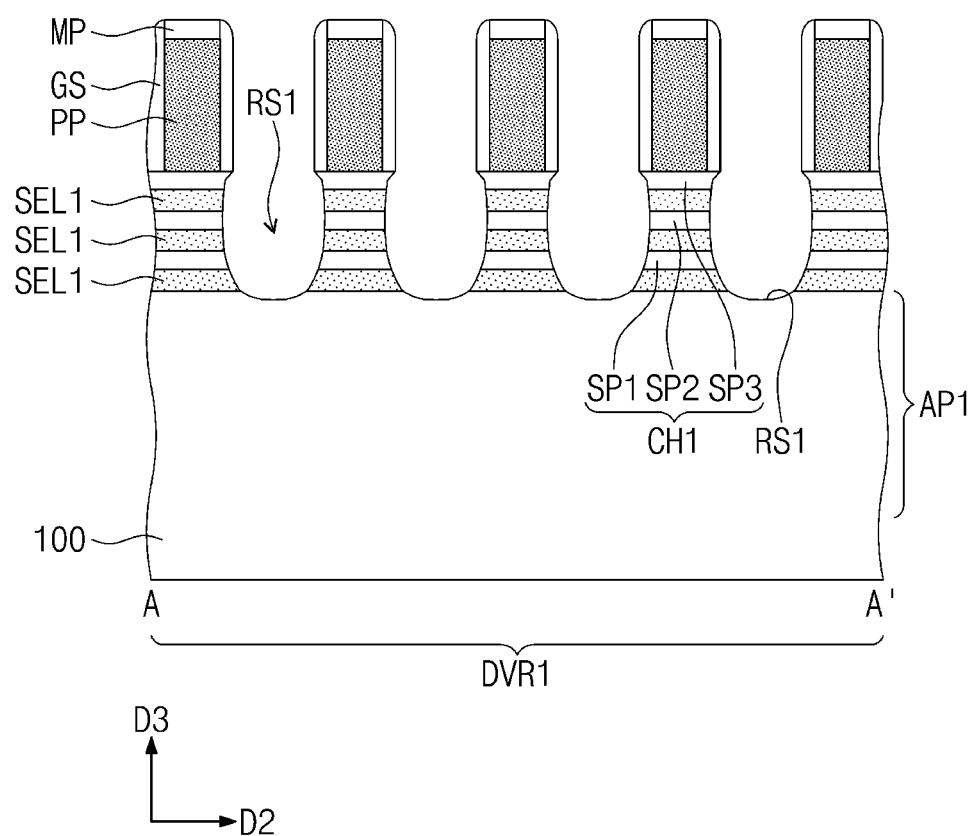
Figure 8B:
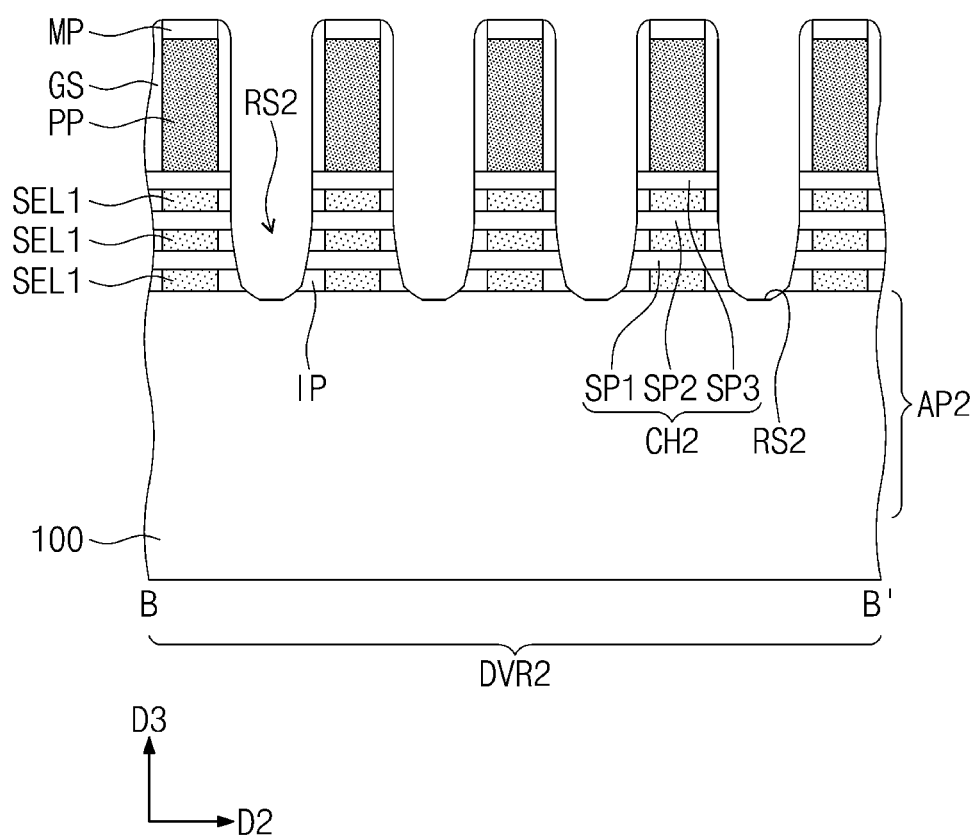
Figure 8C:
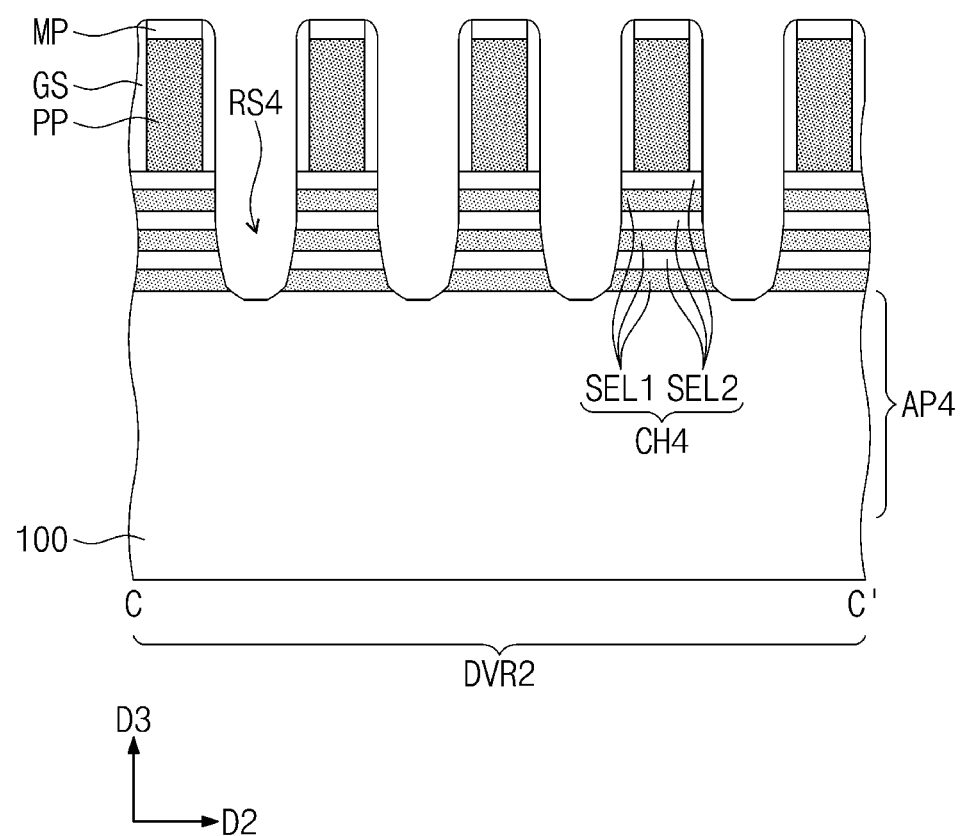
Figure 8D:
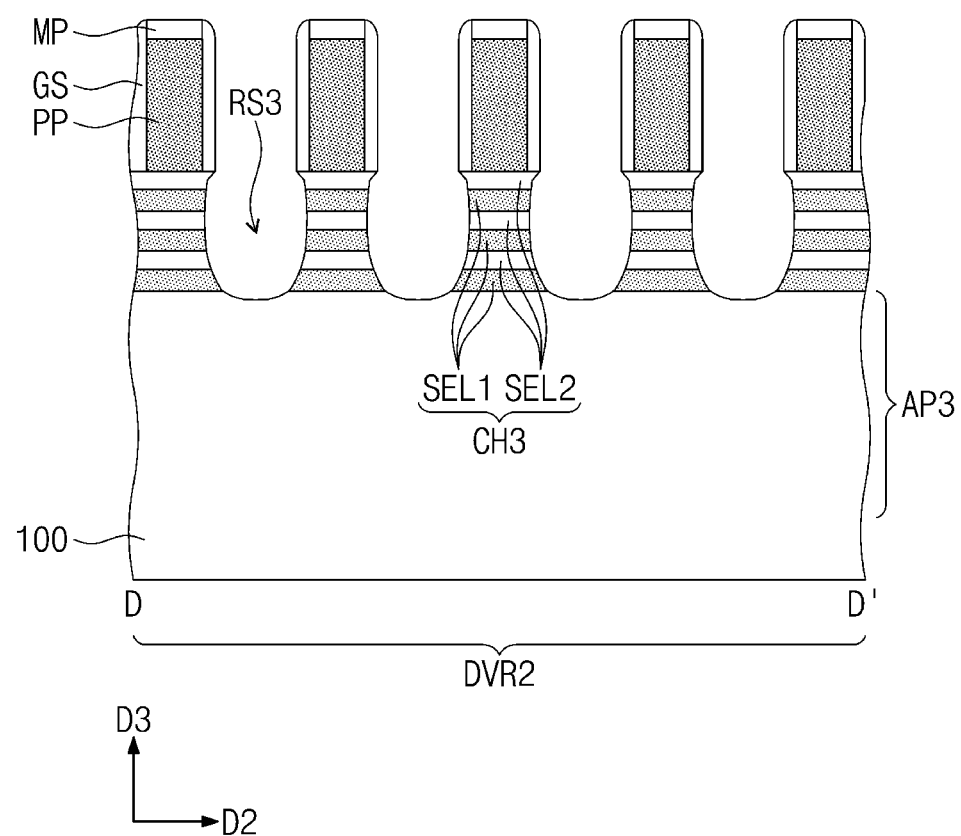
Figure 8E:
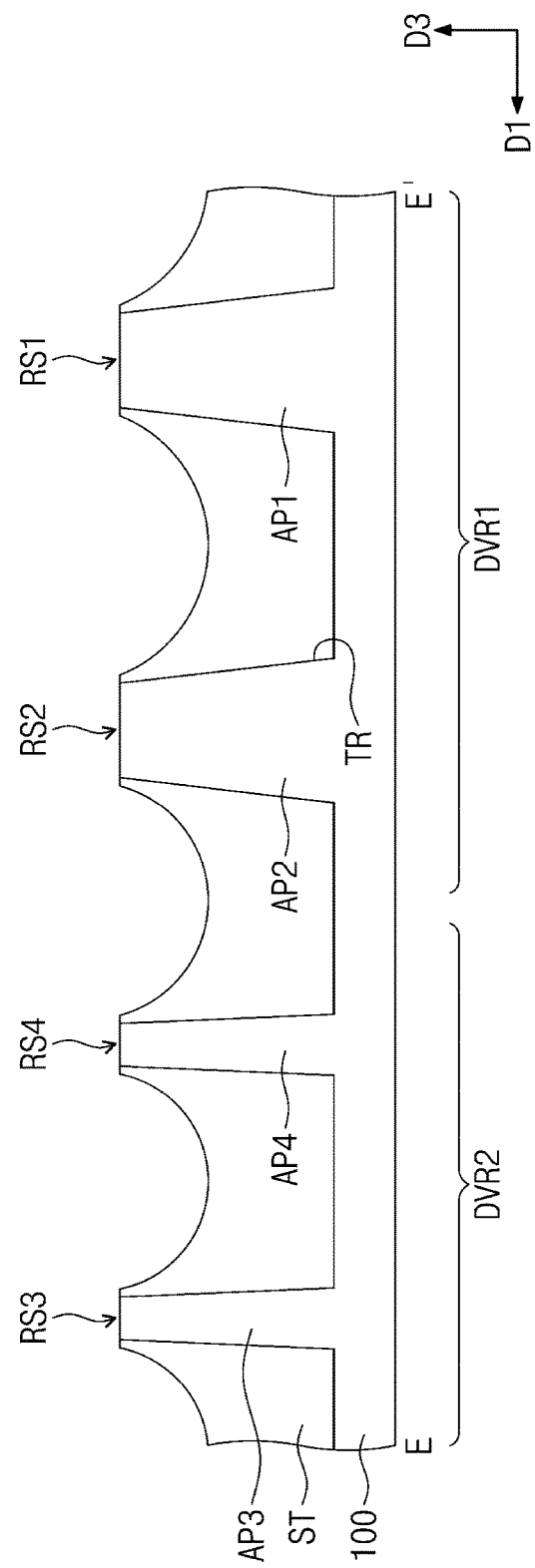
Figure 9A:
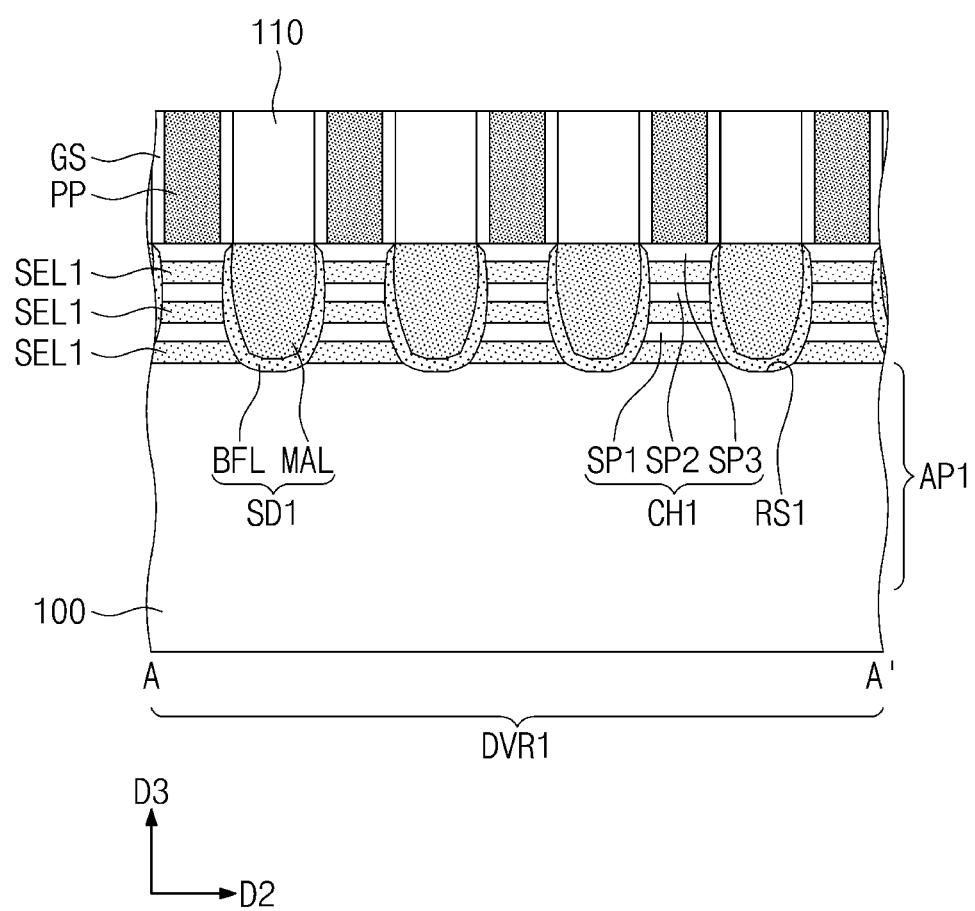
Figure 9B:
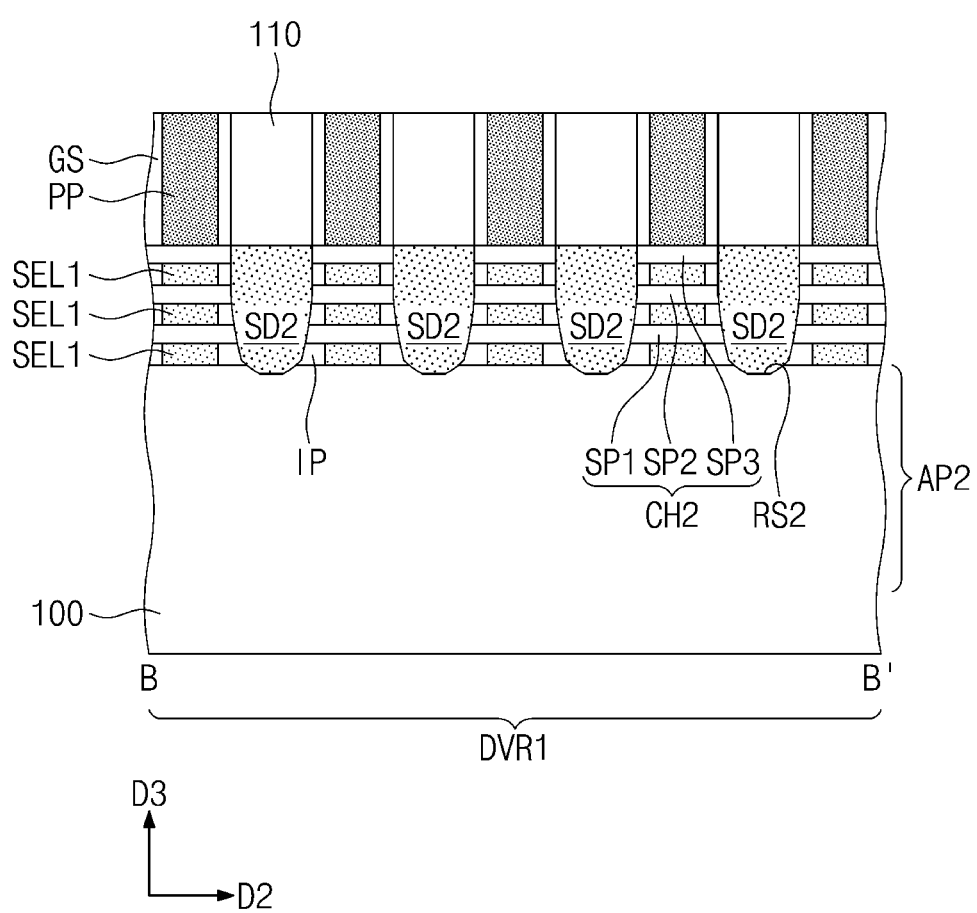
Figure 9C:
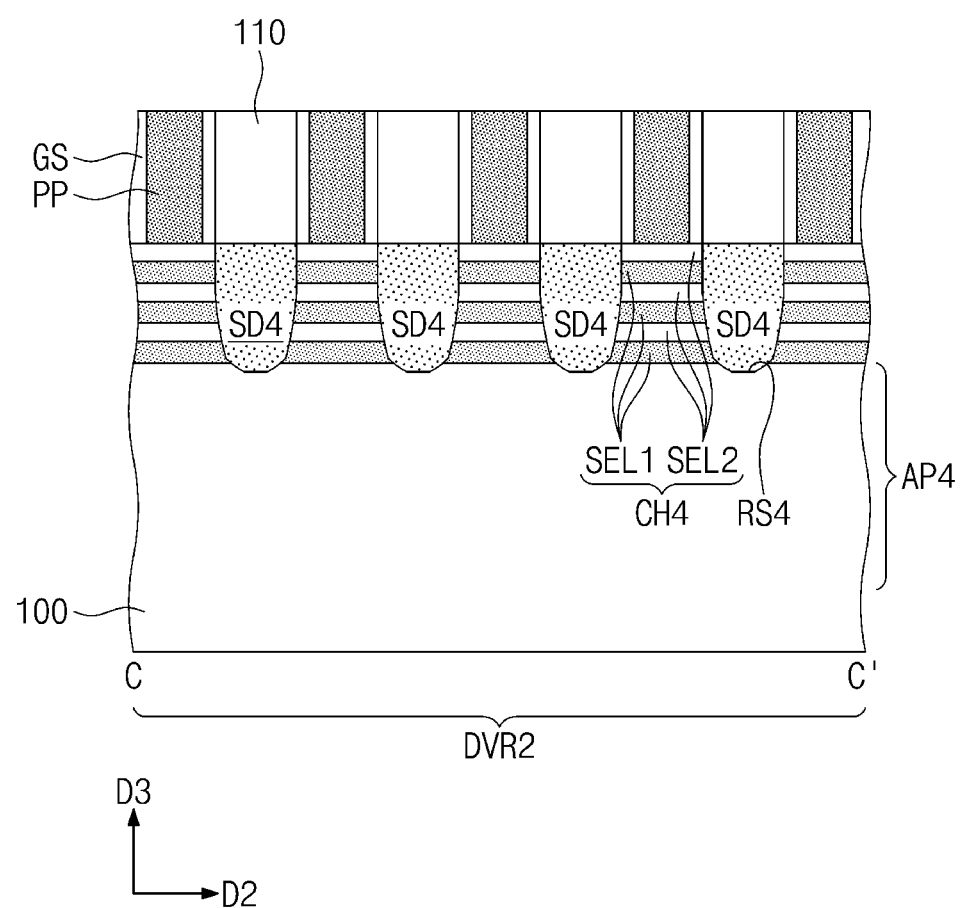
Figure 9D:
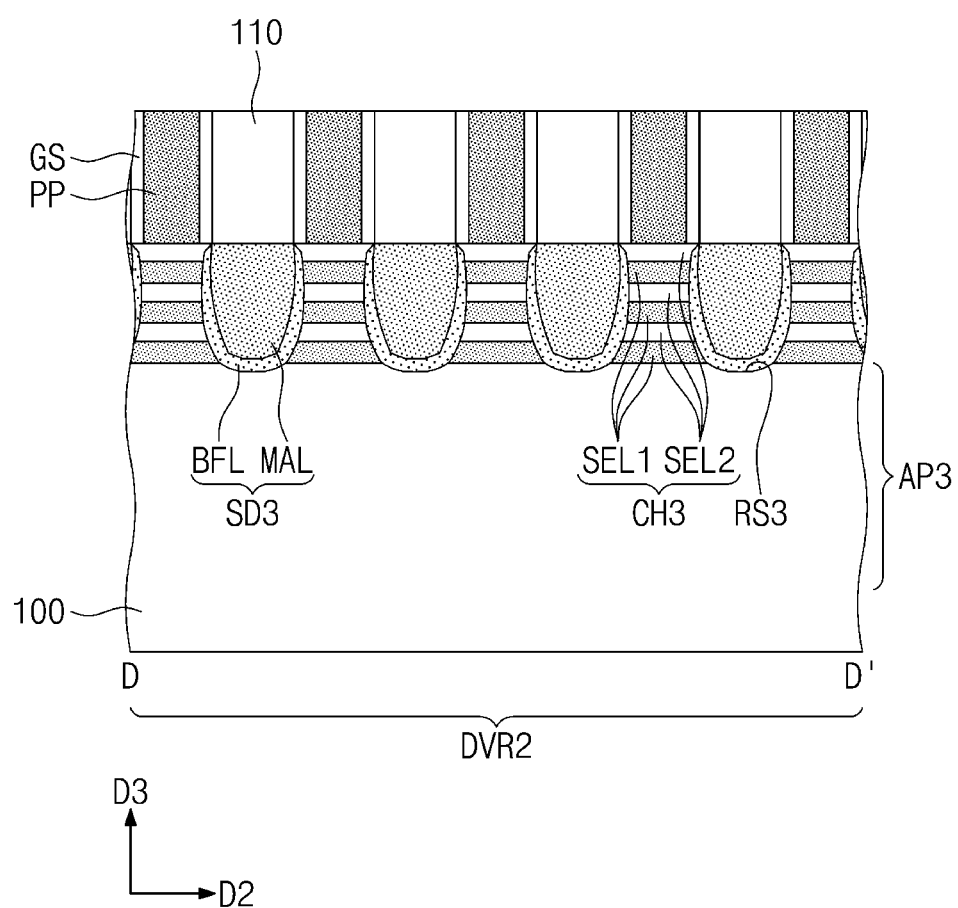
Figure 9E:
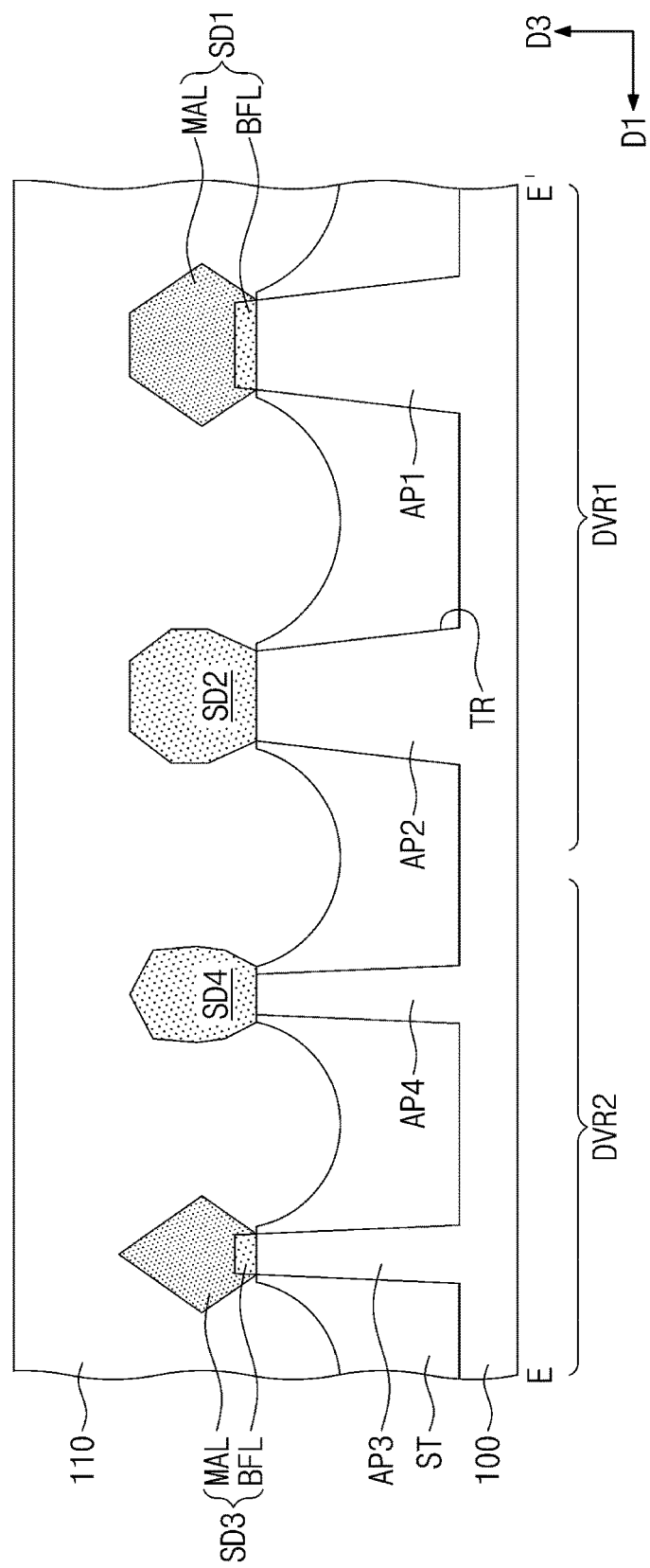

Referring to FIGS. 7A to 7C, sacrificial patterns PP may be formed on the substrate 100 to cross the first to fourth stacking patterns STP1 to STP4. Each of the sacrificial patterns PP may be a line- or bar-shaped pattern that extends in the first direction D1. The sacrificial patterns PP may be arranged at a first pitch in the second direction D2.

In detail, the formation of the sacrificial patterns PP may include forming a sacrificial layer on the substrate 100, forming hard mask patterns MP on the sacrificial layer, and patterning the sacrificial layer using the hard mask patterns MP as an etch mask. For example, the sacrificial layer may be formed of or include polysilicon.

A pair of the gate spacers GS may be formed on opposite side surfaces of each of the sacrificial patterns PP. The formation of the gate spacers GS may include conformally forming a gate spacer layer on the substrate 100 and anisotropically etching the gate spacer layer. In an embodiment, the gate spacer GS may be a multi-layered structure including at least two layers.

Referring to FIGS. 8A to 8E, first to fourth recesses RS1 to RS4 may be formed in the first to fourth stacking patterns STP1 to STP4, respectively. The device isolation layer ST between the first to fourth stacking patterns STP1 to STP4 may be further recessed, during the formation of the first to fourth recesses RS1 to RS4 (e.g., see FIG. 8E).

In detail, the first to fourth recesses RS1 to RS4 may be respectively formed by etching the first to fourth stacking patterns STP1 to STP4 using the hard mask patterns MP and the gate spacers GS as an etch mask. Each of the first to fourth recesses RS1 to RS4 may be formed between a corresponding pair of the sacrificial patterns PP.

The formation of the second recess RS2 may further include forming the inner spacer IP in an empty region, which is formed by recessing the first semiconductor layer SEL1. In detail, the first semiconductor layers SEL1 exposed by the second recess RS2 may be horizontally etched. The inner spacers IP may be formed by at least partially filling empty regions, which are formed by horizontally etching the first semiconductor layers SEL1, with an insulating material.

The first to third semiconductor patterns SP1, SP2, and SP3, which are sequentially stacked between adjacent ones of the first recesses RS1, may be formed from the second semiconductor layers SEL2, respectively. The first to third semiconductor patterns SP1, SP2, and SP3, which are sequentially stacked between adjacent ones of the second recesses RS2, may be formed from the second semiconductor layers SEL2, respectively. The first to third semiconductor patterns SP1, SP2, and SP3 between the adjacent ones of the first recesses RS1 may constitute the first channel pattern CH1. The first to third semiconductor patterns SP1, SP2, and SP3 between the adjacent ones of the second recesses RS2 may constitute the second channel pattern CH2.

The first and second semiconductor layers SEL1 and SEL2 between adjacent ones of the third recesses RS3 may constitute the third channel pattern CH3. The first and second semiconductor layers SEL1 and SEL2 between adjacent ones of the fourth recesses RS4 may constitute the fourth channel pattern CH4.

Referring to FIGS. 9A to 9E, the first source/drain patterns SD1 may be formed in the first recesses RS1, respectively. In detail, the buffer layer BFL may be formed by a first SEG process using an inner surface of the first recess RS1 as a seed layer. The buffer layer BFL may be grown using the first to third semiconductor patterns SP1, SP2, and SP3 and the substrate 100, which are exposed through the first recess RS1, as a seed layer. As an example, the first SEG process may include a chemical vapor deposition (CVD) process or a molecular beam epitaxy (MBE) process.

The buffer layer BFL may contain a semiconductor material (e.g., SiGe) whose lattice constant is greater than that of a semiconductor material of the substrate 100. The buffer layer BFL may contain a relatively low concentration of germanium (Ge). In another embodiment, the buffer layer BFL may contain only silicon (Si), without germanium (Ge). A germanium concentration of the buffer layer BFL may range from about 0 at % to about 10 at %.

A second SEG process may be performed on the buffer layer BFL to form the main layer MAL. The main layer MAL may be formed to fully fill the first recess RS1. The main layer MAL may contain a relatively high concentration of germanium. In an embodiment, the germanium concentration of the main layer MAL may range from 30 at % to 70 at %.

The first source/drain pattern SD1 may be doped in-situ with p-type impurities (e.g., boron, gallium, or indium) during the formation of the buffer and main layers BFL and MAL. Alternatively, impurities may be injected into the first source/drain pattern SD1, after the formation of the first source/drain pattern SD1.

The second source/drain patterns SD2 may be formed in the second recesses RS2, respectively. In detail, the second source/drain pattern SD2 may be formed by performing a third SEG process, in which an inner surface of the second recess RS2 is used as a seed layer. In an embodiment, the second source/drain pattern SD2 may be formed of or include the same semiconductor material (e.g., Si) as the substrate 100.

During the formation of the second source/drain pattern SD2, the second source/drain pattern SD2 may be doped in-situ with n-type impurities (e.g., phosphorus, arsenic, or antimony). Alternatively, impurities may be injected into the second source/drain pattern SD2, after the formation of the second source/drain pattern SD2.

The third source/drain patterns SD3 may be formed in the third recesses RS3, respectively. In an embodiment, the third source/drain patterns SD3 may be formed concurrently with the first source/drain patterns SD1 described above. In another embodiment, the third source/drain patterns SD3 may be independently formed by a different process from the first source/drain patterns SD1 described above.

The fourth source/drain patterns SD4 may be formed in the fourth recesses RS4, respectively. In an embodiment, the fourth source/drain patterns SD4 may be formed concurrently with the second source/drain patterns SD2 described above. In another embodiment, the fourth source/drain patterns SD4 may be independently formed by a different process from the second source/drain patterns SD2 described above.

The first interlayer insulating layer 110 may be formed to at least partially cover the first to fourth source/drain patterns SD1 to SD4, the hard mask patterns MP, and the gate spacers GS. In an embodiment, the first interlayer insulating layer 110 may include a silicon oxide layer.

The first interlayer insulating layer 110 may be planarized to expose the top surfaces of the sacrificial patterns PP. The planarization of the first interlayer insulating layer 110 may be performed using an etch-back or chemical-mechanical polishing (CMP) process. All or substantially all of the hard mask patterns MP may be removed during the planarization process. Accordingly, the first interlayered insulating layer 110 may have a top surface that is coplanar with the top surfaces of the sacrificial patterns PP and the top surfaces of the gate spacers GS.

Referring to FIGS. 10A to 10E, a photolithography process may be performed to selectively open a region of the sacrificial pattern PP. For example, a region of the sacrificial pattern PP on the third and fourth borders BD3 and BD4 of the first logic cell SC1 may be selectively opened. The opened region of the sacrificial pattern PP may be selectively etched and removed. The gate cutting pattern CT may be formed by at least partially filling a space, which is formed by removing the sacrificial pattern PP, with an insulating material.

In an embodiment, the exposed sacrificial patterns PP may be selectively removed. As a result of the removal of the sacrificial patterns PP, an outer region ORG exposing first to fourth channel patterns CH1 to CH4 may be formed (e.g., see FIG. 10E). The removal of the sacrificial patterns PP may include a wet etching process, which is performed using an etching solution capable of selectively etching polysilicon.

Figure 10A:
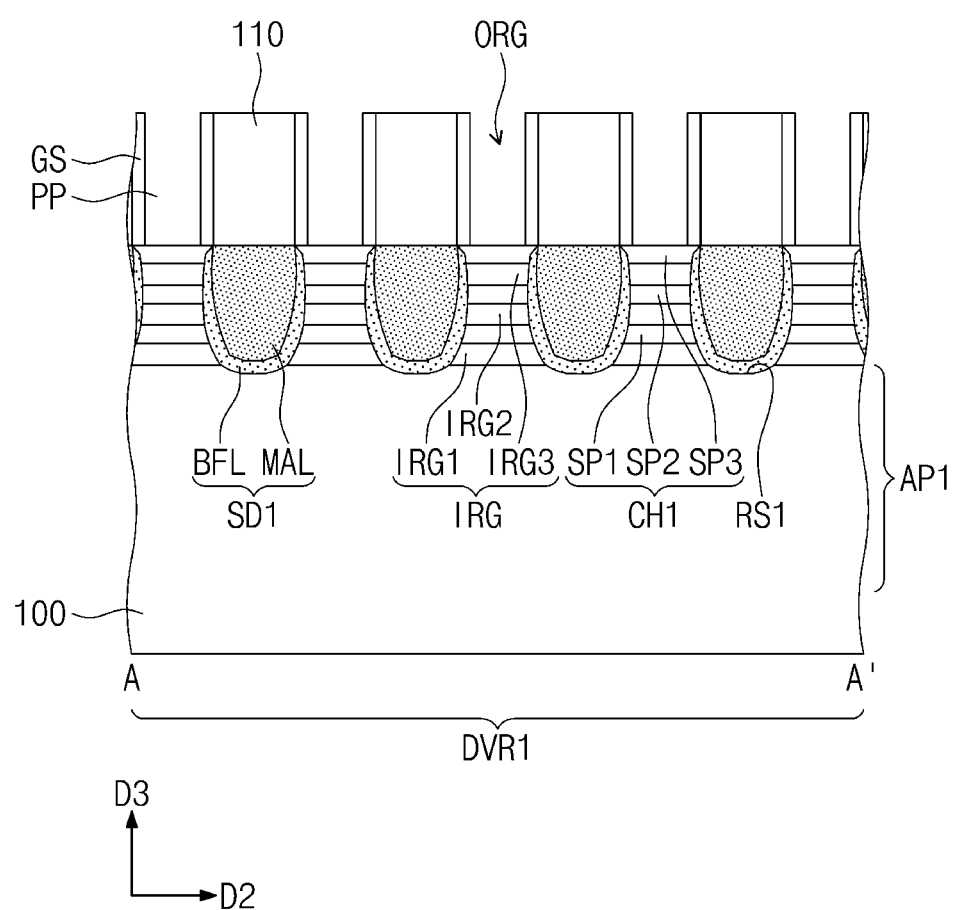
Figure 10B:
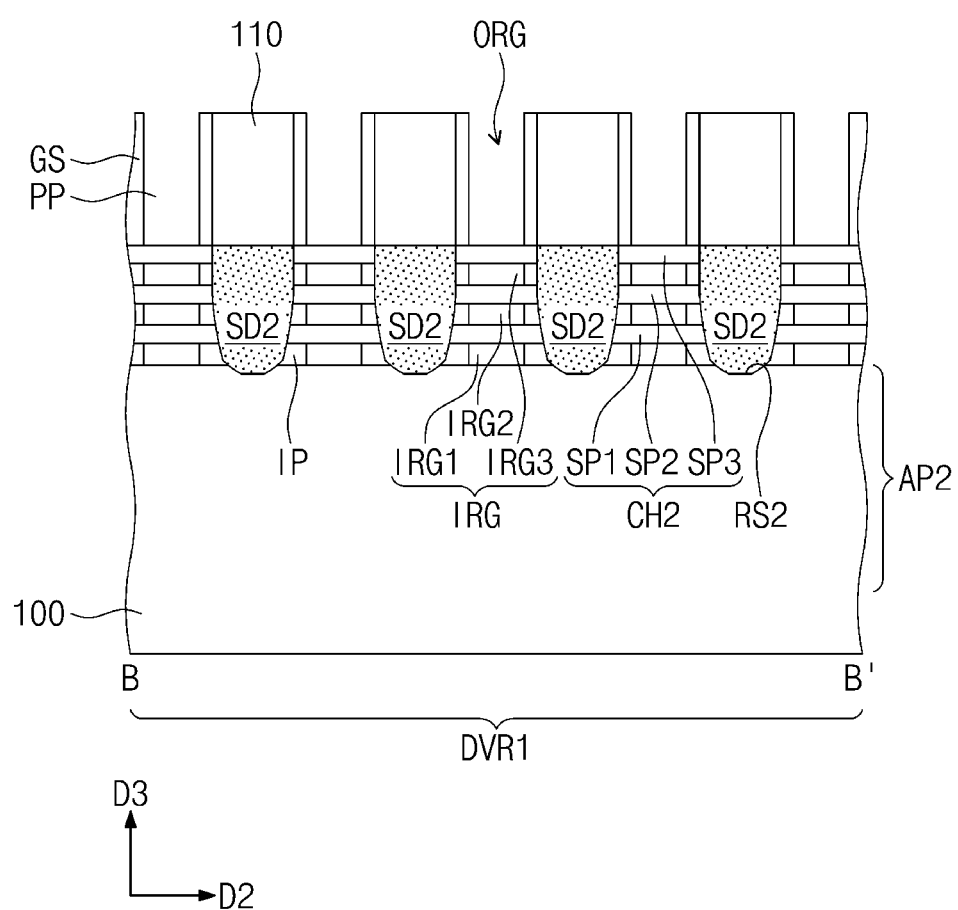
Figure 10C:
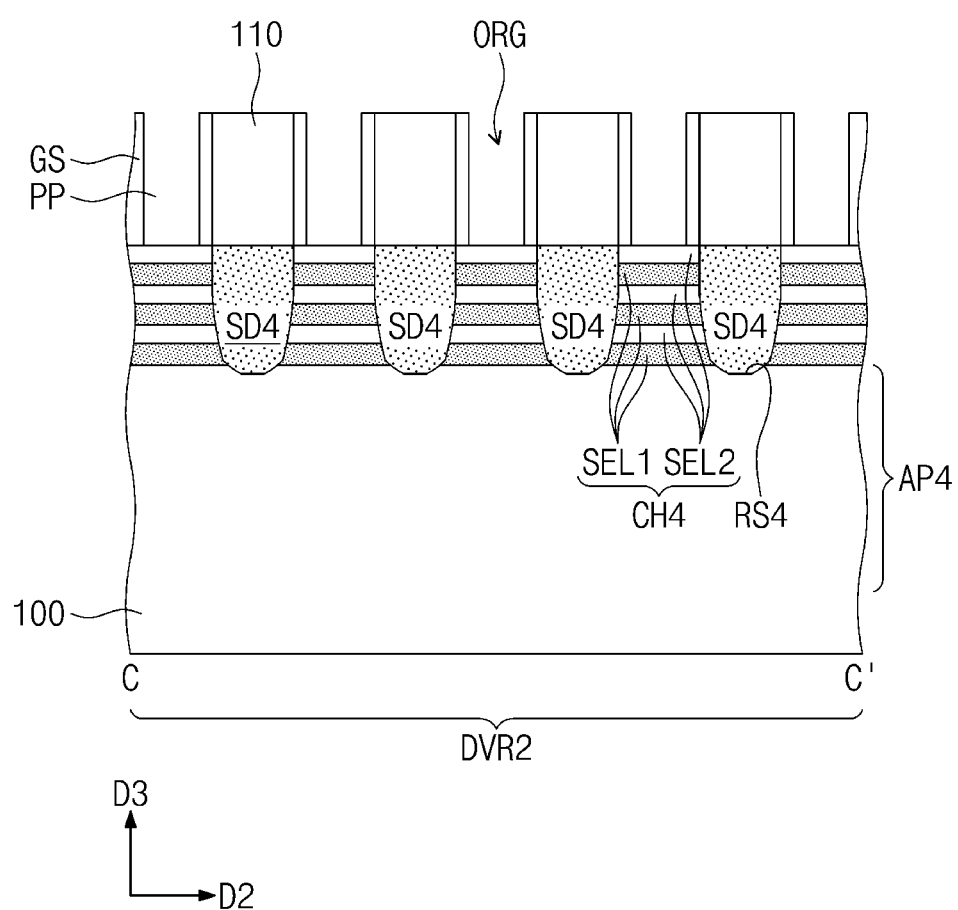
Figure 10D:
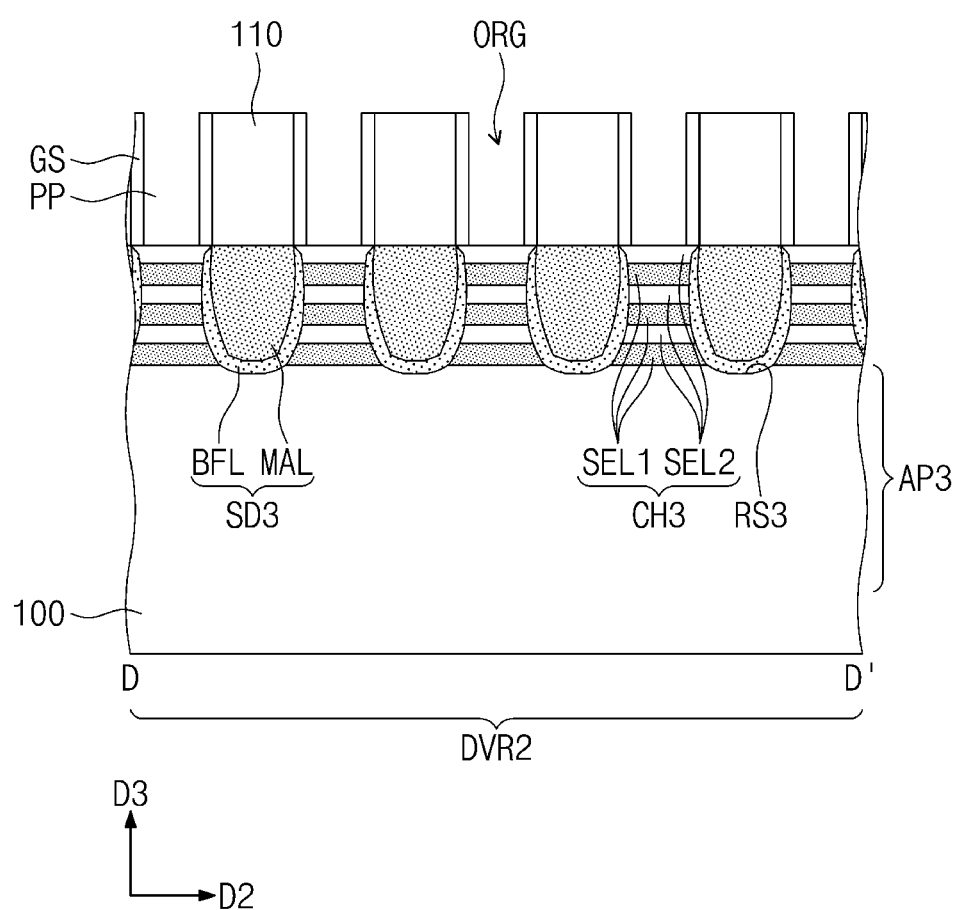
Figure 10E:
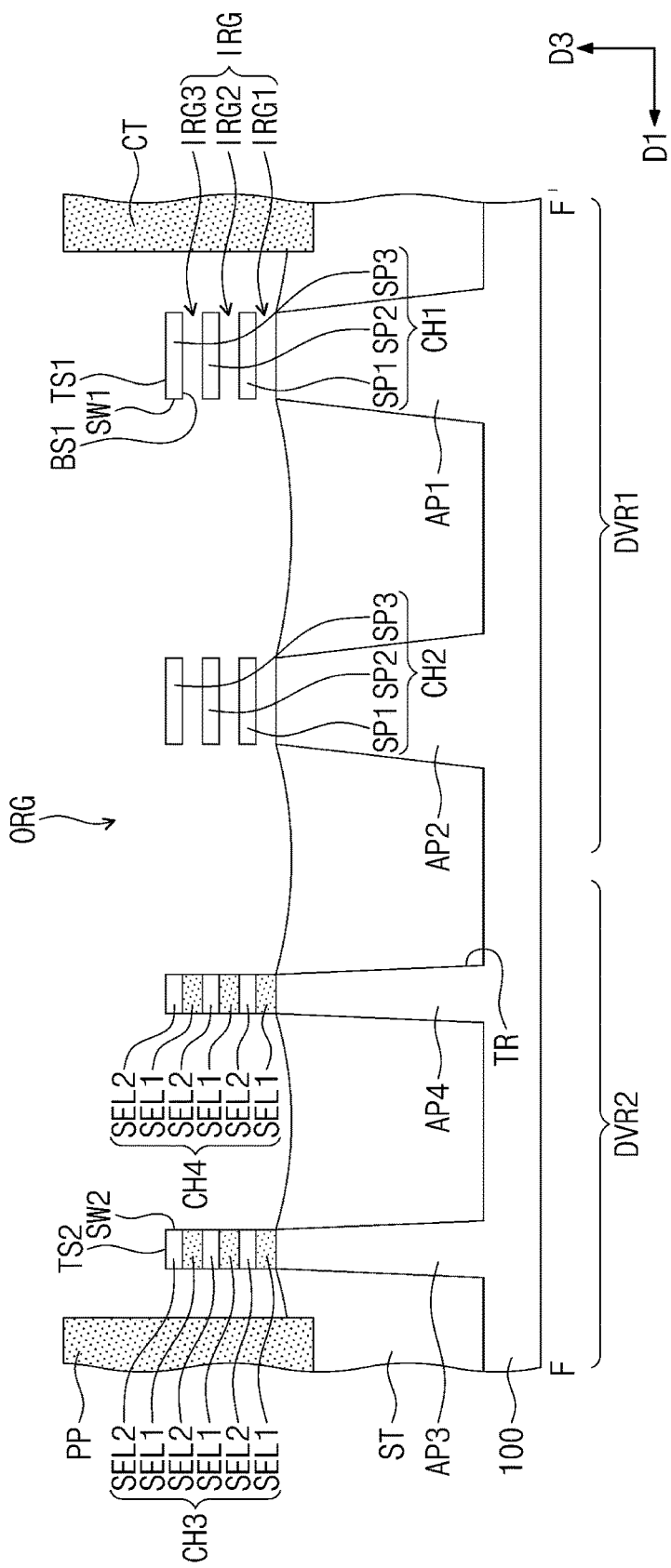
Figure 11A:
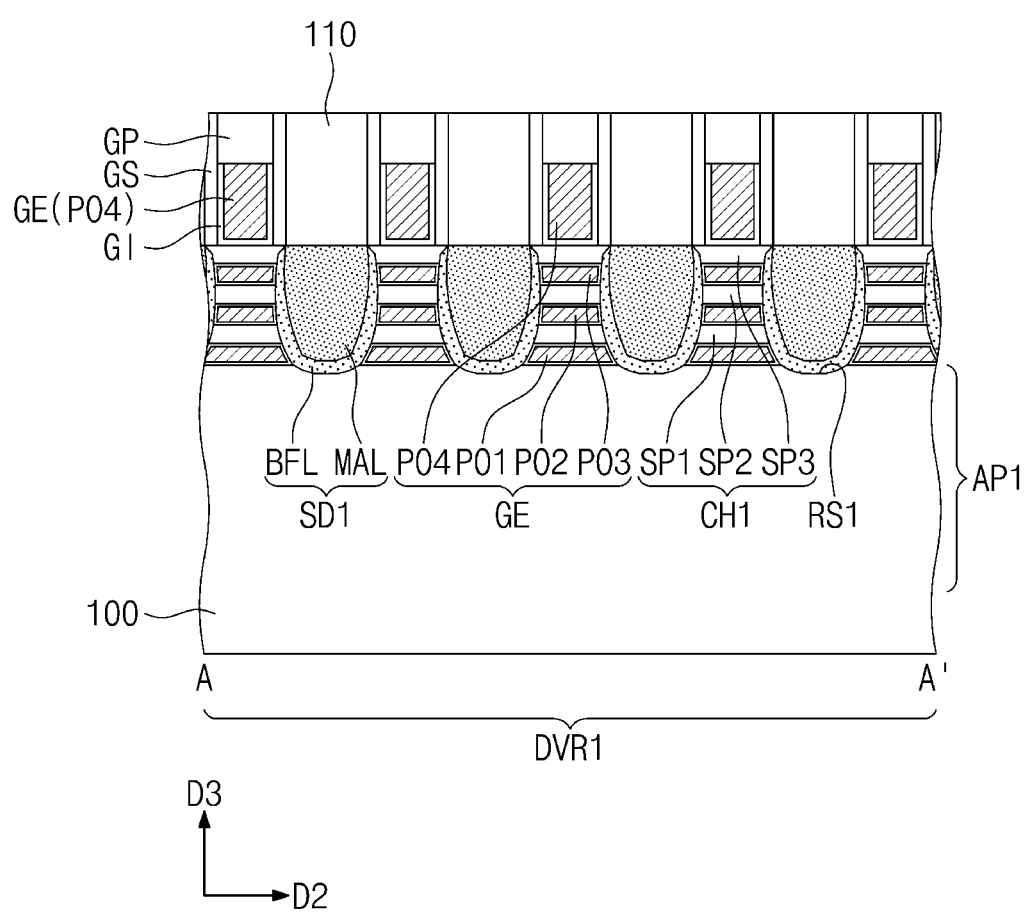
Figure 11B:
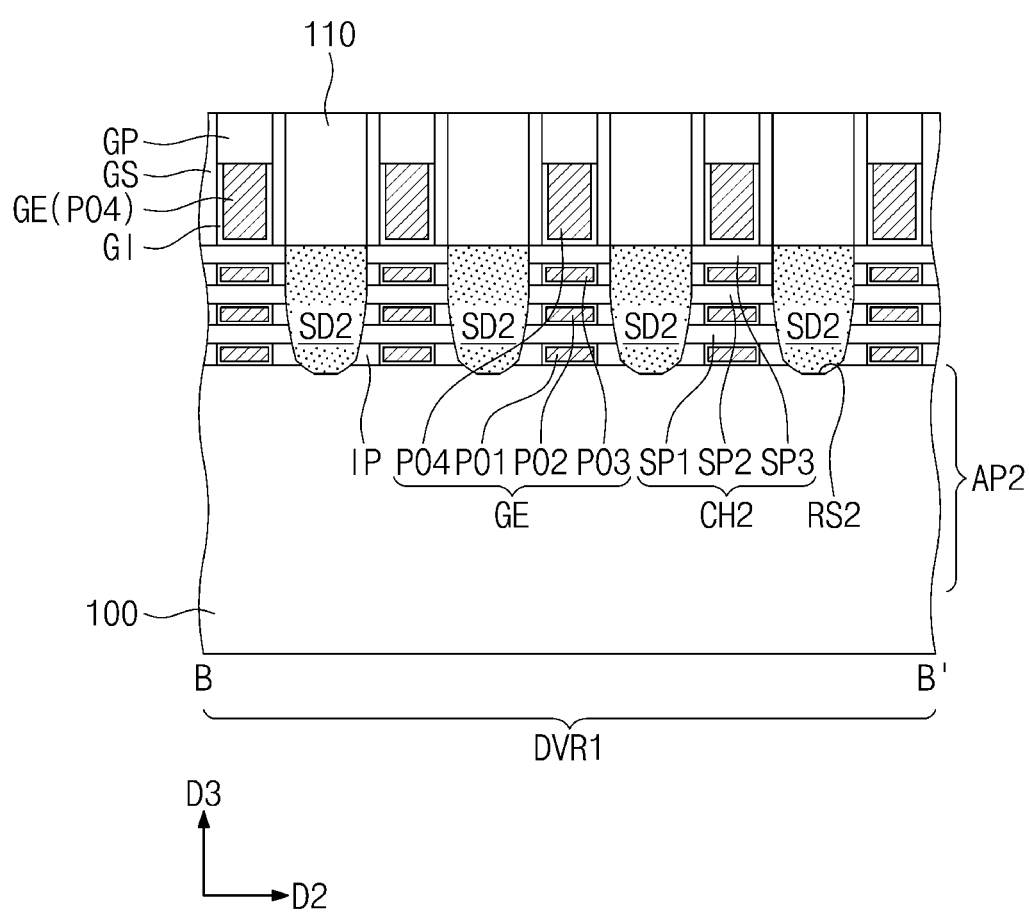
Figure 11C:
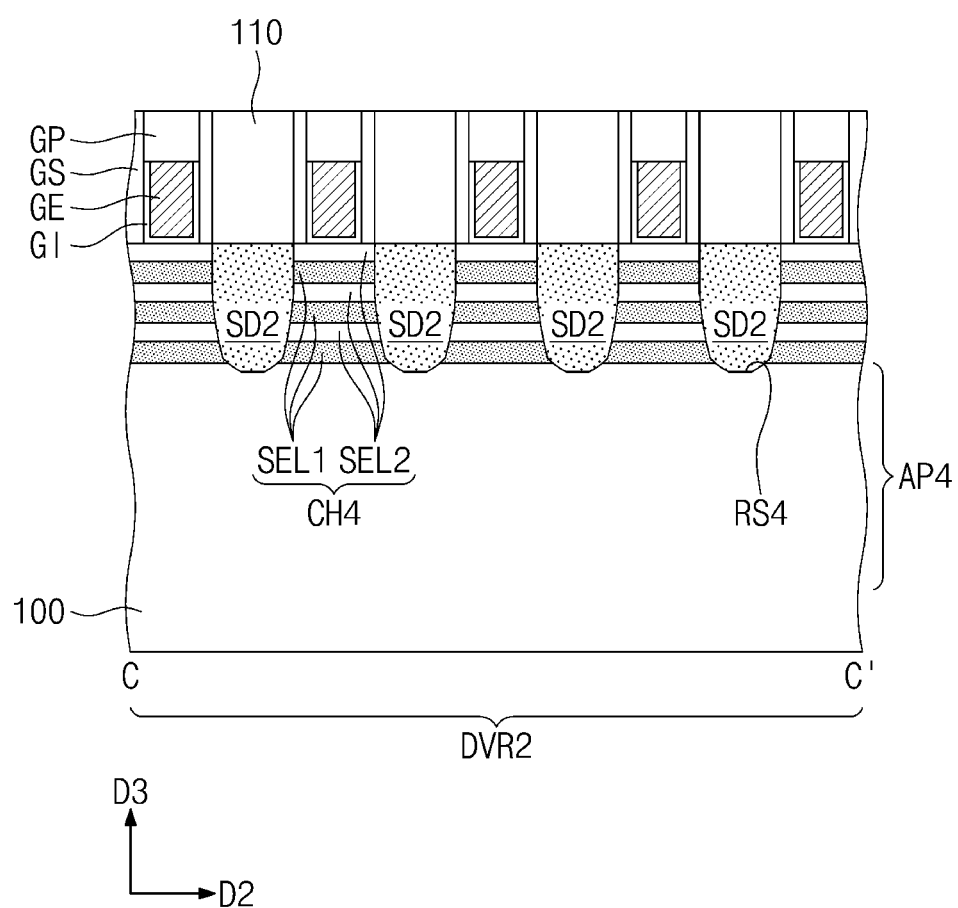
Figure 11D:
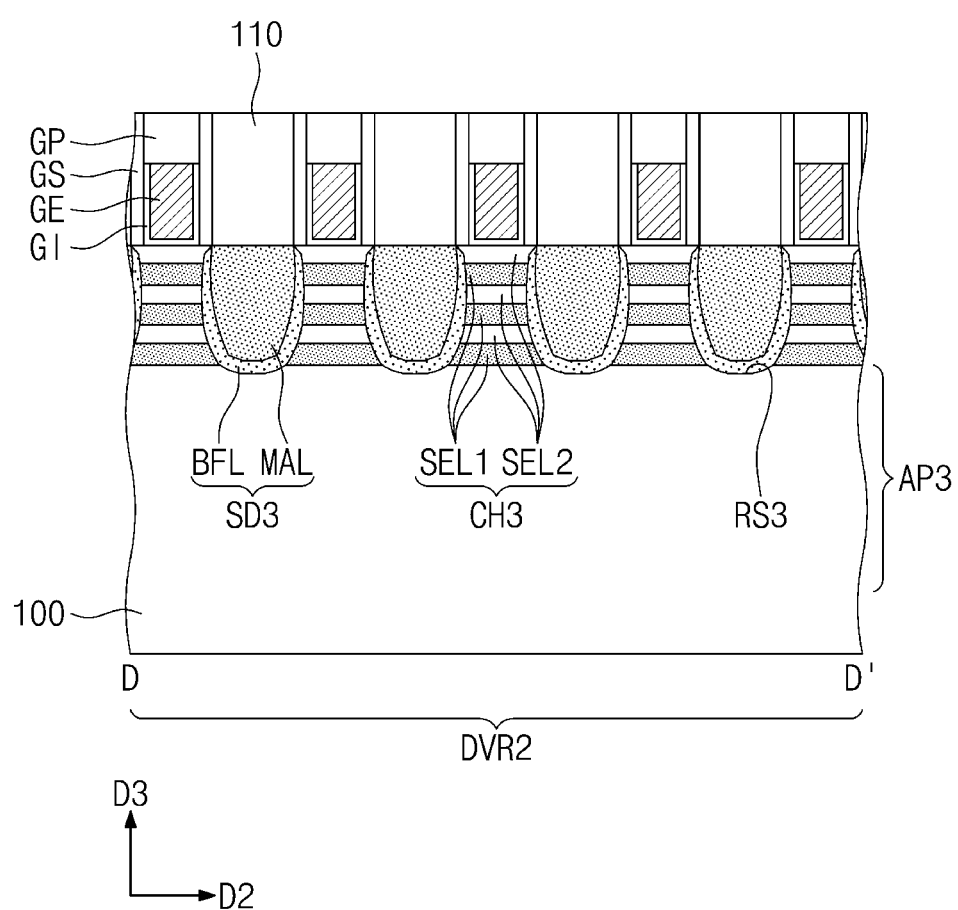
Figure 11E:
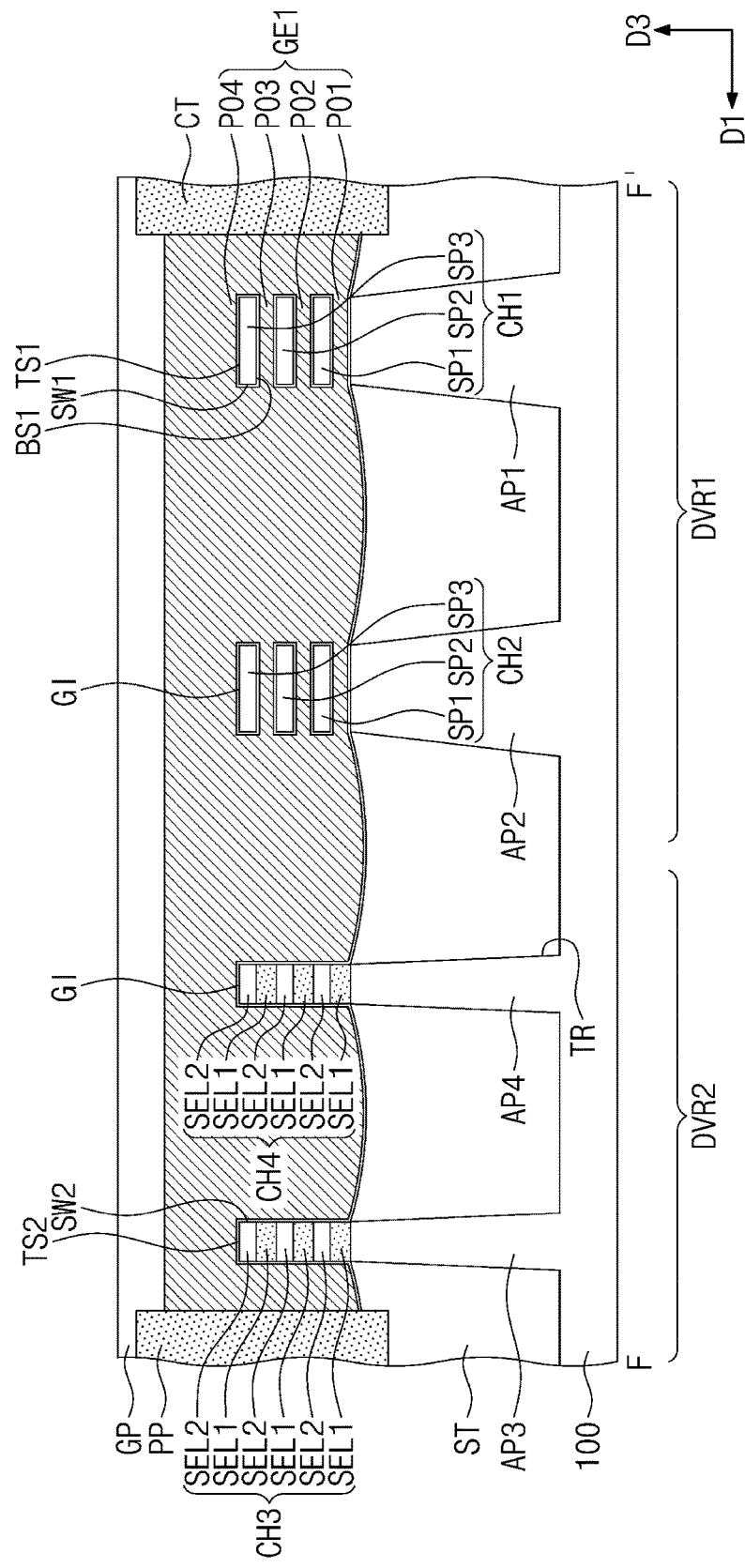

The first semiconductor layers SEL1 on the first device region DVR1 may be selectively removed to form inner regions IRG (e.g., see FIG. 10E). In detail, a selective etching process may be performed to leave the first to third semiconductor patterns SP1, SP2, and SP3 on the first device region DVR1 and to remove only the first semiconductor layers SEL1. The etching process may be chosen to have a high etch rate for a material (e.g., SiGe) having a relatively high germanium concentration. For example, the etching process may be chosen to have a high etch rate for a silicon germanium layer whose germanium concentration is higher than about 10 at %.

In an embodiment, a mask layer may be formed to at least partially cover the outer region ORG on the second device region DVR2, and the first semiconductor layers SEL1 exposed on the first device region DVR1 may be selectively removed. Accordingly, the first semiconductor layers SEL1 on the second device region DVR2 may not be removed and may be left substantially intact.

Since the first semiconductor layers SEL1 are selectively removed from the first device region DVR1, only the first to third semiconductor patterns SP1, SP2, and SP3 stacked may be left on each of the first and second active patterns AP1 and AP2. As a result of the removal of the first semiconductor layers SEL1, first to third inner regions IRG1, IRG2, and IRG3 may be formed, respectively.

In detail, the first inner region IRG1 may be formed between the active pattern AP1 or AP2 and the first semiconductor pattern SP1, the second inner region IRG2 may be formed between the first semiconductor pattern SP1 and the second semiconductor pattern SP2, and the third inner region IRG3 may be formed between the second semiconductor pattern SP2 and the third semiconductor pattern SP3.

Referring to FIGS. 11A to 11E, the gate insulating layer GI may be conformally formed on the exposed first to fourth channel patterns CH1 to CH4. For example, the gate insulating layer GI may be formed to directly at least partially cover the first top surface TS1, the first bottom surface BS1, and the opposite first side surfaces SW1 of each of the first to third semiconductor patterns SP1 to SP3. The gate insulating layer GI may be formed to directly at least partially cover the second top surface TS2 and the opposite second side surfaces SW2 of each of the third and fourth channel patterns CH3 and CH4.

The gate electrode GE may be formed on the gate insulating layer GI. The gate electrode GE on the first device region DVR1 may include the first to third portions PO1, PO2, and PO3, which are respectively formed in the first to third inner regions IRG1, IRG2, and IRG3, and the fourth portion PO4, which is formed in the outer region ORG.

The gate electrode GE may be recessed to have a reduced height. Upper portions of first and second gate cutting patterns CT1 and CT2 may be slightly recessed, during the recessing of the gate electrode GE. The gate capping pattern GP may be formed on the recessed gate electrode GE.

Referring back to FIGS. 5A to 5F, the second interlayer insulating layer 120 may be formed on the first interlayer insulating layer 110. The second interlayer insulating layer 120 may include a silicon oxide layer. The active contacts AC may be formed to penetrate the second interlayer insulating layer 120 and the first interlayer insulating layer 110 and may be electrically connected to the first to fourth source/drain patterns SD1-SD4. The gate contacts GC may be formed to penetrate the second interlayer insulating layer 120 and the gate capping pattern GP and to be electrically connected to the gate electrodes GE, respectively.

The formation of each of the active and gate contacts AC and GC may include forming the barrier pattern BM and forming the conductive pattern FM on the barrier pattern BM. The barrier pattern BM may be conformally formed and may include a metal layer and a metal nitride layer. The conductive pattern FM may be formed of or include a low resistance metal.

A pair of the division structures DB may be respectively formed on the first and second borders BD1 and BD2 of the first logic cell SC1. The division structure DB may penetrate the second interlayer insulating layer 120 and the gate electrode GE and may extend into the active pattern AP1 to AP4. The division structure DB may be formed of or include an insulating material (e.g., silicon oxide or silicon nitride).

The third interlayer insulating layer 130 may be formed on the active contacts AC and the gate contacts GC. The first metal layer M1 may be formed in the third interlayer insulating layer 130. In detail, the first vias VI1, which are respectively connected to the active and gate contacts AC and GC, may be formed in a lower portion of the third interlayer insulating layer 130. The interconnection lines M1_R1, M1_R2, M1_R3, and M1_I, which are in contact with the first vias VI1, may be formed in an upper portion of the third interlayer insulating layer 130. The fourth interlayer insulating layer 140 may be formed on the third interlayer insulating layer 130. The second metal layer M2 may be formed in the fourth interlayer insulating layer 140.

Figure 12A:
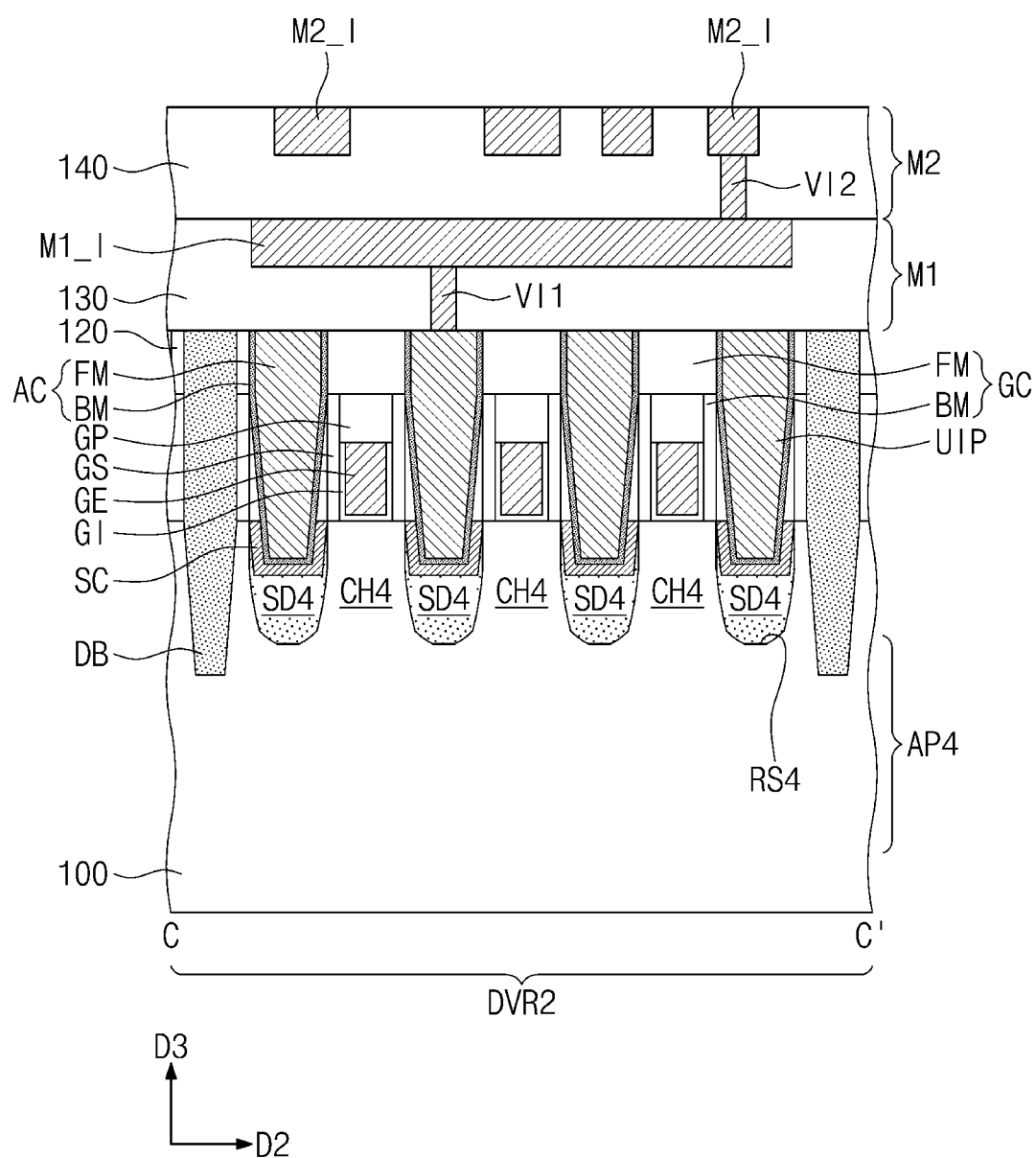
FIGS. 12A to 12C are sectional views, which are respectively taken along lines C-C', D-D', and F-F' of FIG. 4, that illustrate a semiconductor device according to an embodiment of the inventive concept.
Figure 12B:
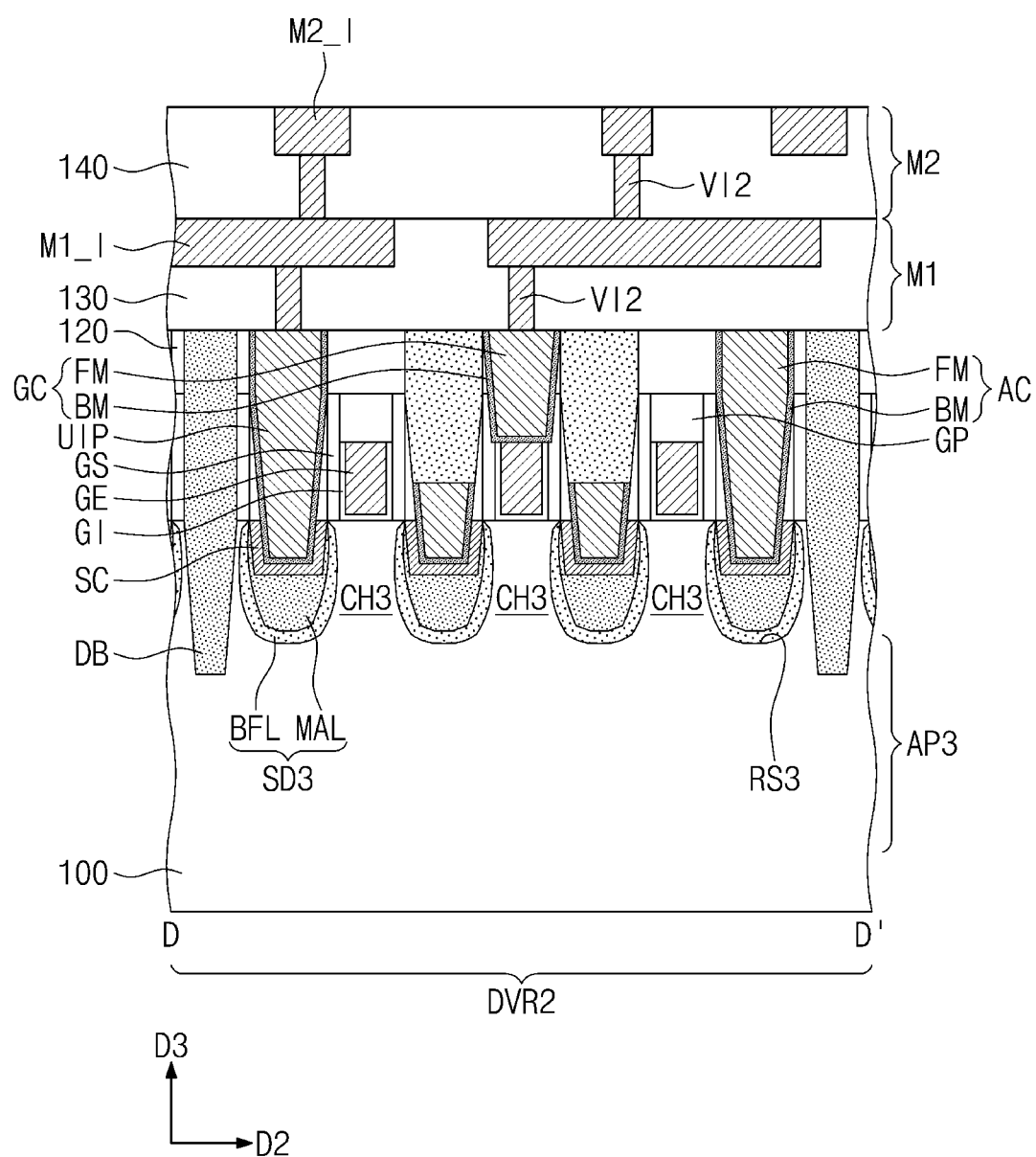
Figure 12C:
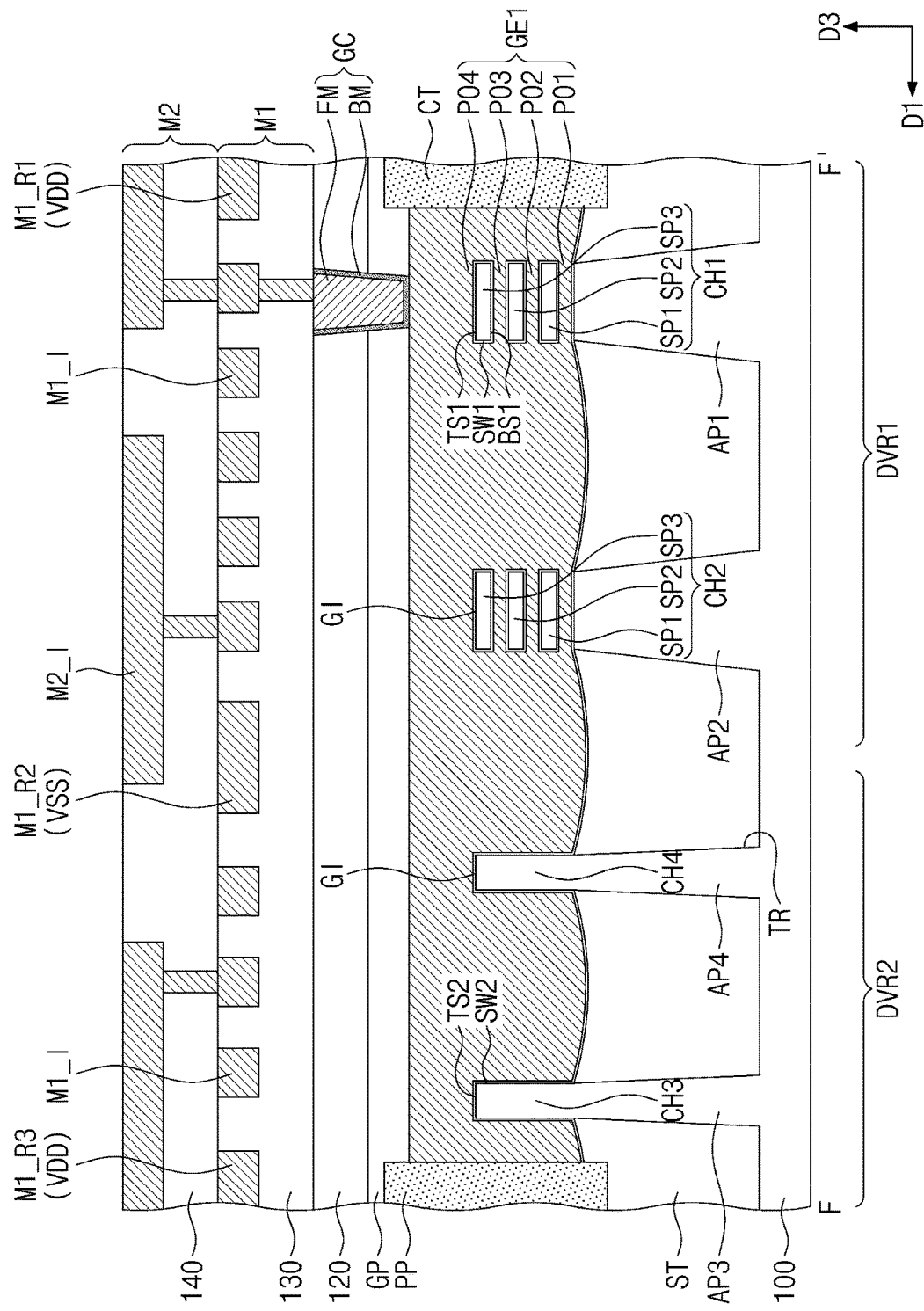

FIGS. 12A to 12C are sectional views, which are respectively taken along lines C-C', D-D', and F-F' of FIG. 4 to illustrate a semiconductor device according to an embodiment of the inventive concept. For concise description, an element previously described with reference to FIGS. 4 and 5A to 5F may be identified by the same reference number without repeating a description thereof.

Referring to FIGS. 4 and 12A to 12C, the third channel pattern CH3 may be an upper portion of the third active pattern AP3 and may be formed of or include the same semiconductor material as the third active pattern AP3. In other words, the third channel pattern CH3 and the third active pattern AP3 may be connected to form a single or monolithic object, and there may be no interface therebetween.

The fourth channel pattern CH4 may be an upper portion of the fourth active pattern AP4 and may be formed of or include the same semiconductor material as the fourth active pattern AP4. In other words, the fourth channel pattern CH4 and the fourth active pattern AP4 may be connected to form a single or monolithic object, and there may be no interface therebetween. In an embodiment, the third and fourth channel patterns CH3 and CH4 may be formed concurrently with the third and fourth active patterns AP3 and AP4 by a process of patterning a bulk silicon substrate.

In a semiconductor device according to an embodiment of the inventive concept, a first device region having superior performance characteristics and a second device region having low power consumption characteristics may be combined to constitute a hybrid logic cell. By combining the first and second device regions, it may be possible to realize an integrated circuit having both of high performance and low power consumption characteristics.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
    a substrate including a first device region and a second device region, which are adjacent to each other in a first direction and extend in a second direction crossing the first direction;
    a first active pattern of a first width on the first device region;
    a second active pattern on the second device region, the second active pattern having a second width smaller than the first width;
    a first channel pattern on the first active pattern and a first source/drain pattern connected to the first channel pattern, the first channel pattern comprising a plurality of semiconductor patterns, which are vertically stacked and spaced apart from each other;
    a second channel pattern on the second active pattern and a second source/drain pattern connected to the second channel pattern, the second channel pattern vertically protruding from the second active pattern; and
    a gate electrode that extends from the first channel pattern to the second channel pattern in the first direction,
    wherein the gate electrode is adjacent to a first top surface, a first bottom surface, and opposite first side surfaces of each of the plurality of semiconductor patterns,
    wherein the gate electrode is adjacent to a second top surface and opposite second side surfaces of the second channel pattern, and
    wherein the second channel pattern comprises first semiconductor layers and second semiconductor layers, which are alternately stacked and in which adjacent ones of the first semiconductor layers and second semiconductor layers directly contact each other.

2. The semiconductor device of claim 1, further comprising a first metal layer on the substrate,
    wherein the first metal layer comprises a first power line, a second power line, a third power line, and lower interconnection lines,
    wherein the first to third power lines and the lower interconnection lines extend in the second direction,
    wherein the first device region is between the first and second power lines, and
    wherein the second device region is between the second and third power lines.

3. The semiconductor device of claim 2, wherein the lower interconnection lines comprise:
    first lower interconnection lines between the first and second power lines; and
    second lower interconnection lines between the second and third power lines,
    wherein first interconnection tracks are defined between the first and second power lines, the first lower interconnection lines being in the first interconnection tracks,
    wherein second interconnection tracks are defined between the second and third power lines, the second lower interconnection lines being in the second interconnection tracks, and
    wherein a number of the first interconnection tracks is greater than a number of the second interconnection tracks.

4. The semiconductor device of claim 2, wherein a pitch between the first and second power lines is greater than a pitch between the second and third power lines.

5. The semiconductor device of claim 1, wherein the first source/drain pattern has a same conductivity type as the second source/drain pattern.

6. The semiconductor device of claim 1, further comprising an active contact connected in common to the first source/drain pattern and the second source/drain pattern, which are adjacent to each other in the first direction.

7. The semiconductor device of claim 1, wherein the first and second semiconductor layers comprises semiconductor materials, which are different from each other and are chosen from the group consisting of silicon, germanium, and silicon-germanium.

8. The semiconductor device of claim 7, wherein the second semiconductor layers are respectively provided at same levels as the plurality of semiconductor patterns in a third direction perpendicular to a plane formed by the first and second directions.

9. The semiconductor device of claim 7, wherein the gate electrode comprises a plurality of portions, which are respectively interposed between the plurality of semiconductor patterns, and
wherein the first semiconductor layers are respectively provided at same levels as the plurality of portions of the gate electrode in a third direction perpendicular to a plane formed by the first and second directions.

10. The semiconductor device of claim 1, wherein the first device region is a GAAFET region, and
wherein the second device region is a FinFET region.

11. A semiconductor device, comprising:
a substrate;
a first power line, a second power line, and third power line on the substrate, the first, second, and third power lines being arranged in a first direction and extending in a second direction crossing the first direction;
a GAAFET region between the first and second power lines;
a FinFET region between the second and third power lines;
a nanosheet channel on the GAAFET region;
a fin channel on the FinFET region; and
a gate electrode that extends from the GAAFET region to the FinFET region in the first direction,
wherein a first height of the GAAFET region in the first direction is greater than a second height of the FinFET region in the first direction,
wherein a fin channel comprises first semiconductor layers and second semiconductor layers, which are alternately stacked, and
wherein the gate electrode does not extend between the first semiconductor layer and the second semiconductor layer.

12. The semiconductor device of claim 11, wherein the GAAFET region operates at a faster operation speed than the FinFET region, and
wherein the FinFET region consumes less power during operation than the GAAFET region.

13. The semiconductor device of claim 11, further comprising:
first lower interconnection lines between the first and second power lines; and
second lower interconnection lines between the second and third power lines,
wherein first interconnection tracks are defined between the first and second power lines, the first lower interconnection lines being in the first interconnection tracks,
wherein second interconnection tracks are defined between the second and third power lines, the second lower interconnection lines being in the second interconnection tracks, and
wherein a number of the first interconnection tracks is greater than a number of the second interconnection tracks.

14. The semiconductor device of claim 11, wherein each of the GAAFET and FinFET regions comprises a PMOSFET region and an NMOSFET region.

15. The semiconductor device of claim 11, wherein the gate electrode is adjacent to a first top surface, a first bottom surface, and opposite first side surfaces of a nanosheet channel of the GAAFET region, and
wherein the gate electrode is adjacent to a second top surface and opposite second side surfaces of a fin channel of the FinFET region.

16. A semiconductor device, comprising:
a first active pattern, a second active pattern, a third active pattern, and a fourth active pattern on a substrate, the first, second, third, and fourth active patterns being sequentially arranged in a first direction and extending in a second direction crossing the first direction;
a first channel pattern, a second channel pattern, a third channel pattern, and a fourth channel pattern provided on the first, second, third, and fourth active patterns, respectively, each of the first and second channel patterns comprising a plurality of semiconductor patterns, which are spaced apart from each other in a vertical stack in a third direction perpendicular to a plane formed by the first direction and the second direction, the third and fourth channel patterns protruding in the third direction from the third and fourth active patterns, respectively;
a gate electrode that extends from the first channel pattern to the fourth channel pattern in the first direction; and
a gate insulating layer between the gate electrode and the first, second, third, and fourth channel patterns,
wherein the gate insulating layer is on a first top surface, a first bottom surface, and opposite first side surfaces of each of the plurality of semiconductor patterns,
wherein the gate insulating layer is on a second top surface and opposite second side surfaces of each of the third and fourth channel patterns, excluding a bottom surface of each of the third and fourth channel patterns, and
wherein each of the third and fourth channel patterns comprises first semiconductor layers and second semiconductor layers, which are alternately stacked and in which adjacent ones of the first semiconductor layers and second semiconductor layers directly contact each other.

17. The semiconductor device of claim 16, further comprising a first metal layer on the substrate,
wherein the first metal layer comprises a power line and lower interconnection lines,
wherein the power line and the lower interconnection lines extend in the second direction, and
wherein the power line is between the second active pattern and the third active pattern when the semiconductor device is viewed in a plan view.

18. The semiconductor device of claim 16,
wherein the first and second semiconductor layers comprises semiconductor materials, which are different from each other and comprise one or more of silicon, germanium, and silicon-germanium.

19. The semiconductor device of claim 18, wherein the second semiconductor layers are respectively provided at the same levels as the plurality of semiconductor patterns in the third direction.

20. The semiconductor device of claim 16, wherein a width of each of the first and second active patterns is larger than a width of each of the third and fourth active patterns.

* * * * *